United States Patent
Vimercati (12)

(10) Patent No.: US 11,751,386 B2
(45) Date of Patent: Sep. 5, 2023

(54) FIELD-EFFECT TRANSISTORS, DEVICES CONTAINING SUCH FIELD-EFFECT TRANSISTORS AND METHODS OF THEIR FORMATION

(71) Applicant: MICRON TECHNOLOGY, INC., Boise, ID (US)

(72) Inventor: Daniele Vimercati, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 119 days.

(21) Appl. No.: 17/399,315

(22) Filed: Aug. 11, 2021

(65) Prior Publication Data
US 2023/0051240 A1  Feb. 16, 2023

(51) Int. Cl.
| | | |
|---|---|---|
| G11C 16/06 | (2006.01) | |
| H10B 41/27 | (2023.01) | |
| G11C 5/02 | (2006.01) | |
| H10B 43/27 | (2023.01) | |

(52) U.S. Cl.
CPC ............. *H10B 41/27* (2023.02); *G11C 5/025* (2013.01); *G11C 16/06* (2013.01); *H10B 43/27* (2023.02)

(58) Field of Classification Search
None
See application file for complete search history.

(56) References Cited

U.S. PATENT DOCUMENTS

| | | | |
|---|---|---|---|
| 5,925,909 A | 7/1999 | Liu et al. | |
| 8,102,709 B2 | 1/2012 | Mikhalev | |
| 8,450,713 B2 * | 5/2013 | Awaya | H10B 63/22 257/E29.32 |
| 10,115,895 B1 * | 10/2018 | Takaki | H01L 27/249 |
| 2008/0144377 A1 * | 6/2008 | Watanabe | H01L 29/40114 438/257 |
| 2012/0068313 A1 * | 3/2012 | Pagaila | H01L 21/486 257/E21.597 |
| 2019/0103467 A1 * | 4/2019 | Takaki | H01L 45/16 |

* cited by examiner

*Primary Examiner* — Tan T. Nguyen
(74) *Attorney, Agent, or Firm* — Dicke, Billig & Czaja, PLLC

(57) ABSTRACT

Field-effect transistors, and integrated circuit devices containing such field-effect transistors, might include a semiconductor material having a first conductivity type, a first source/drain region having a second conductivity type, a second source/drain region having the second conductivity type, a first contact connected to the first source/drain region, a conductor overlying an active area of the semiconductor material and having an annular portion surrounding the first contact and a spur portion extending from an outer perimeter of the annular portion of the conductor, a second contact connected to the second source/drain region outside the annular portion of the conductor, a dielectric between the conductor and the active area, and a third contact overlying the active area and connected to the spur portion of the conductor.

24 Claims, 28 Drawing Sheets

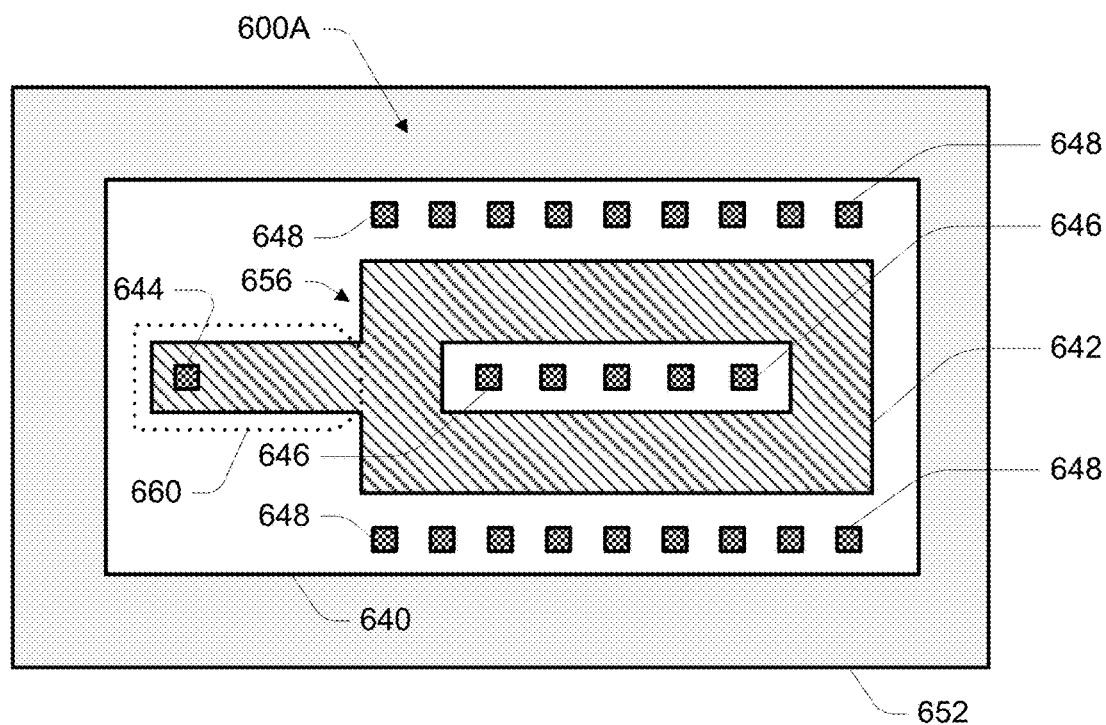
FIG. 6C
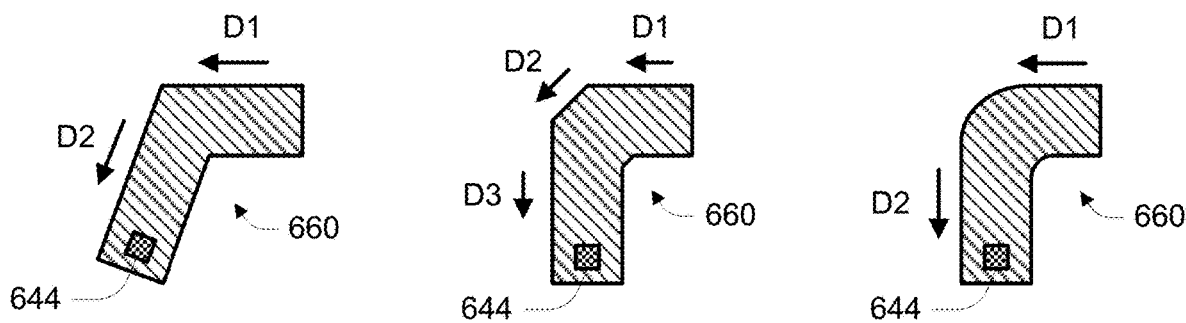
FIG. 6D  FIG. 6E  FIG. 6F

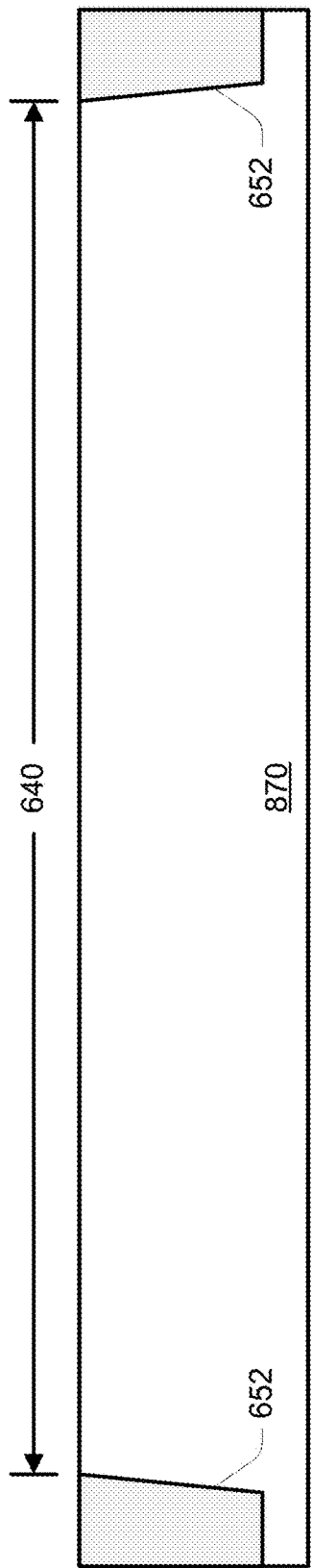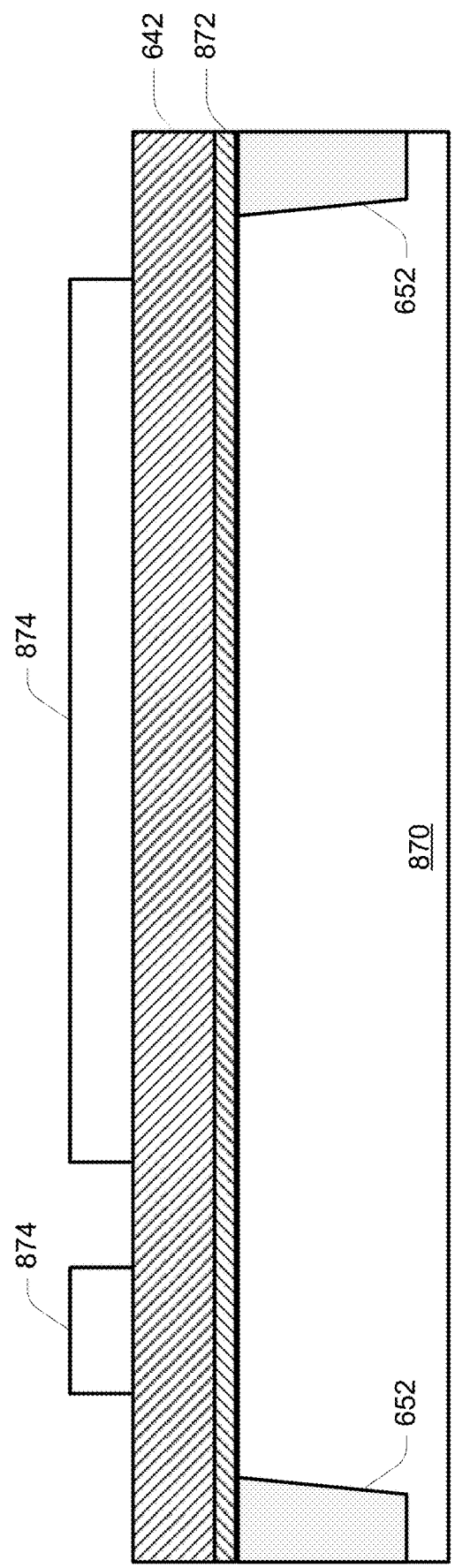

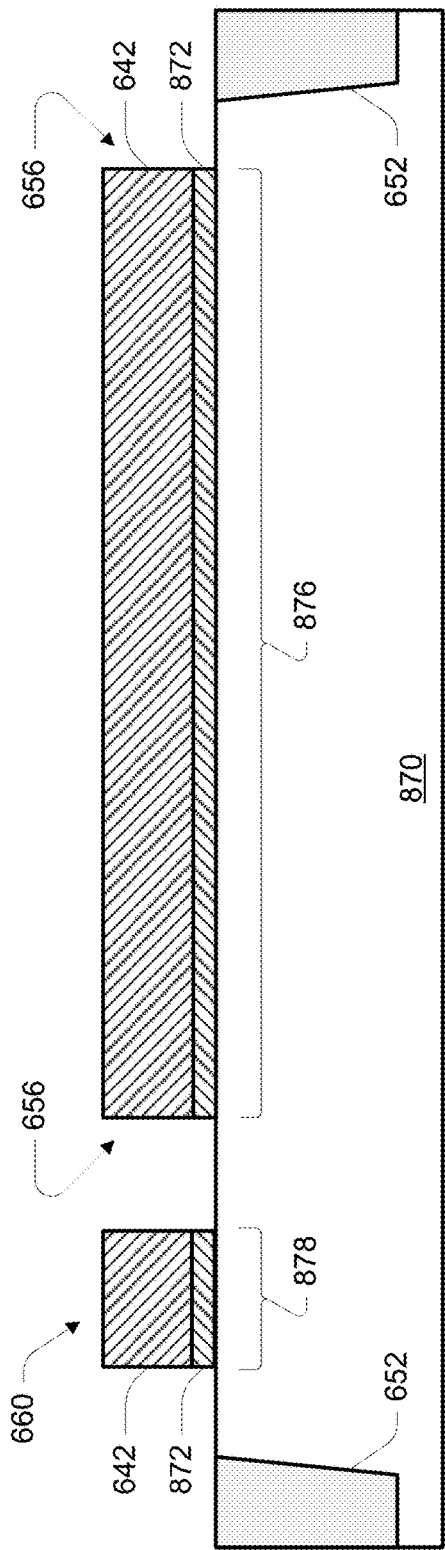
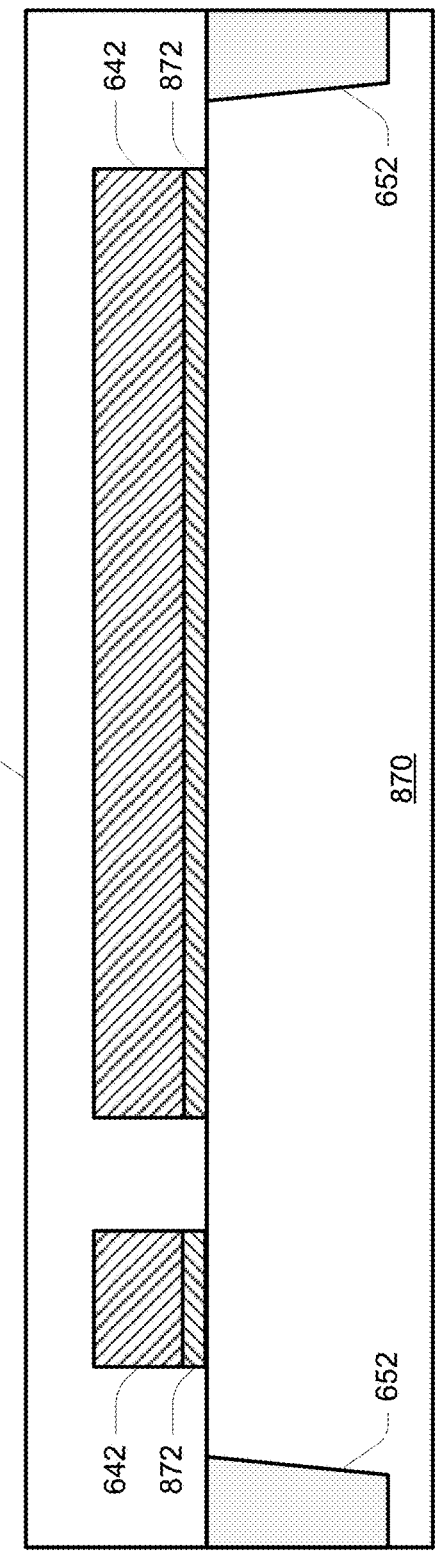
FIG. 8C
FIG. 8D

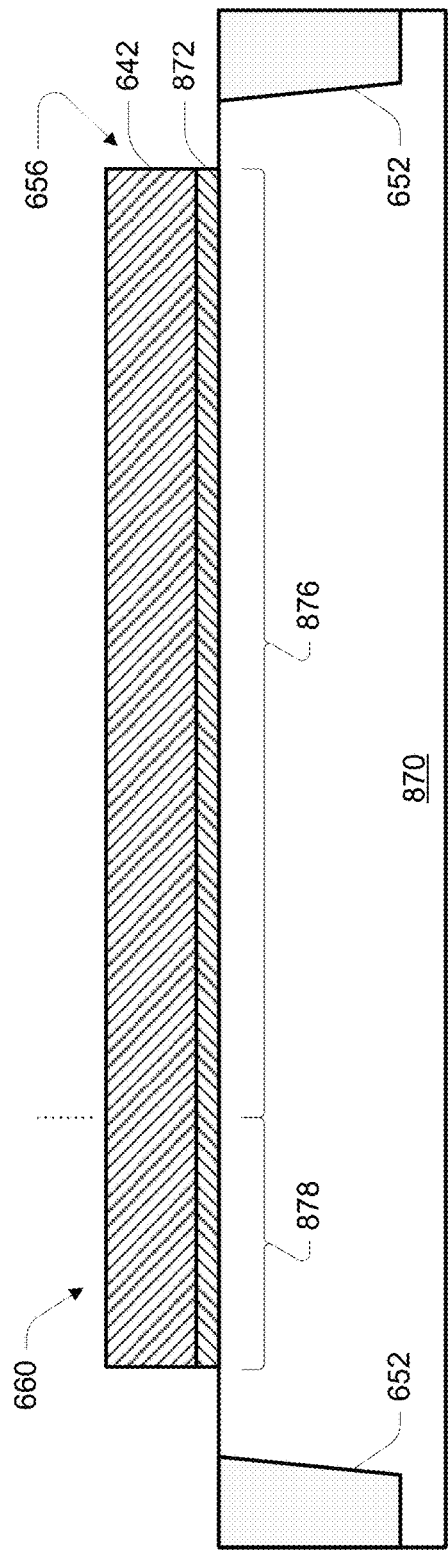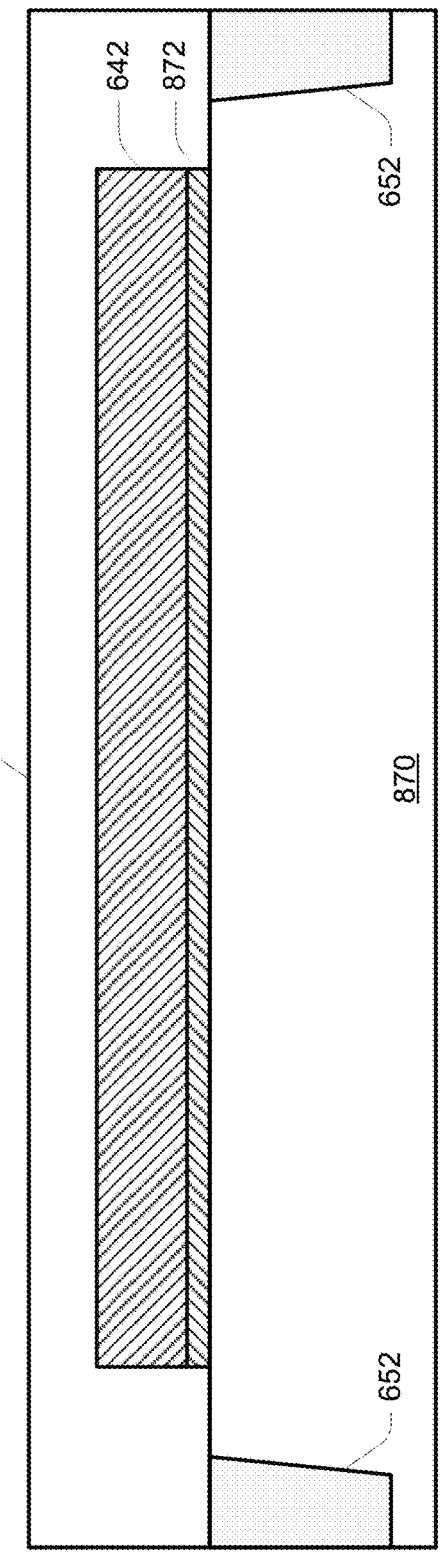

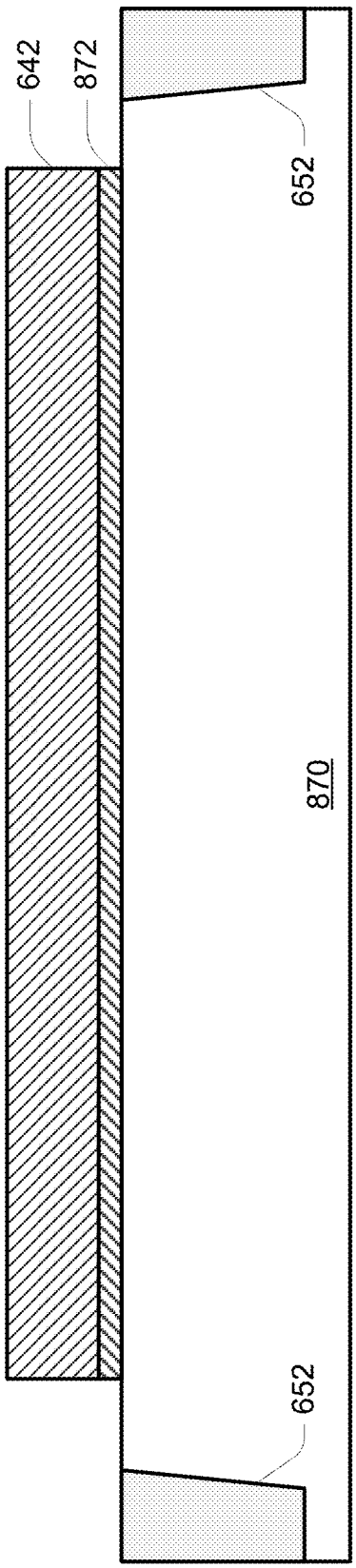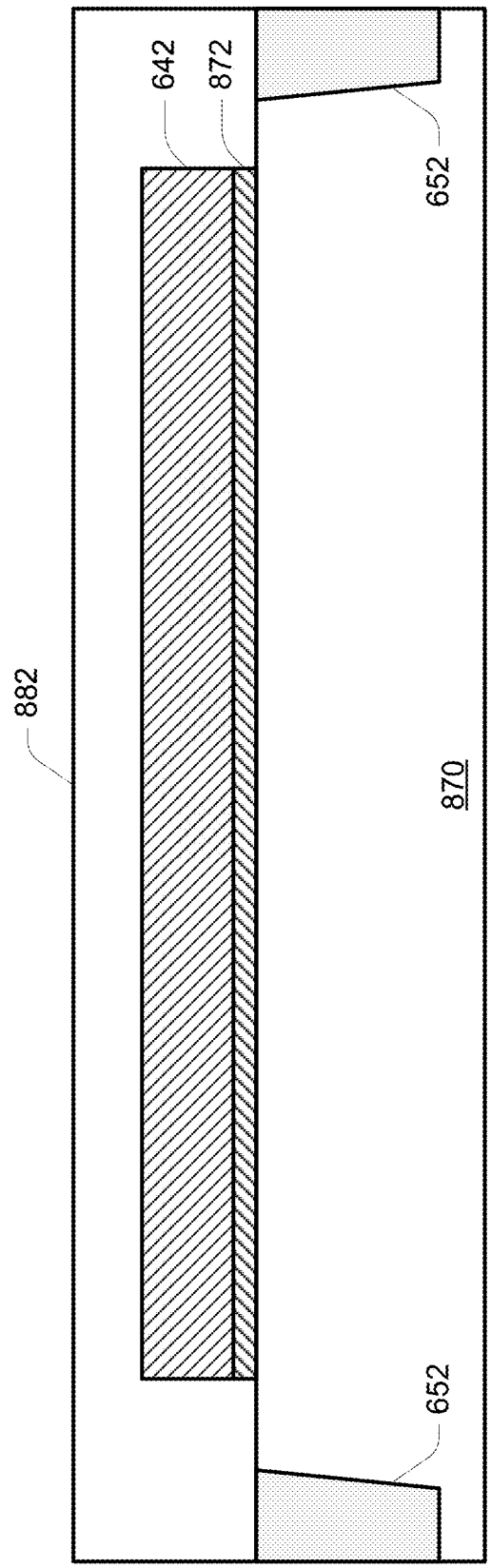

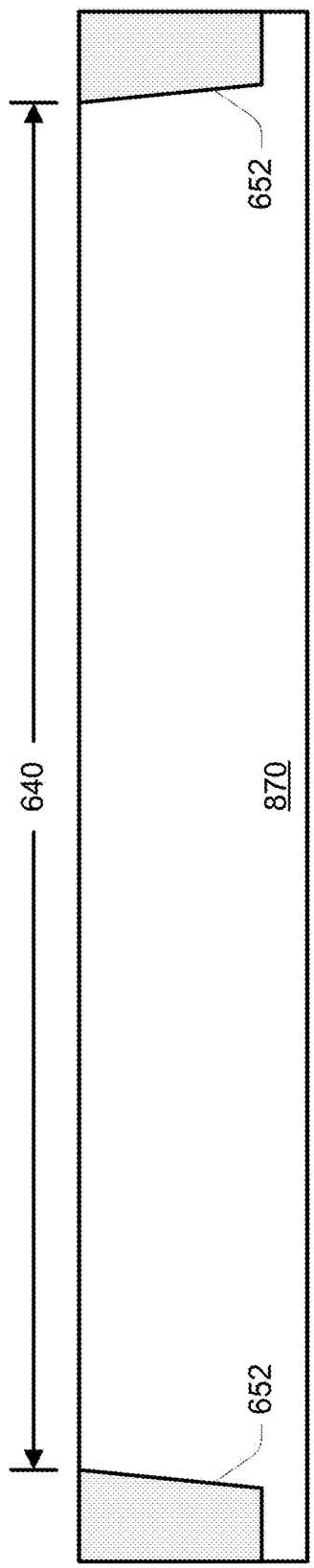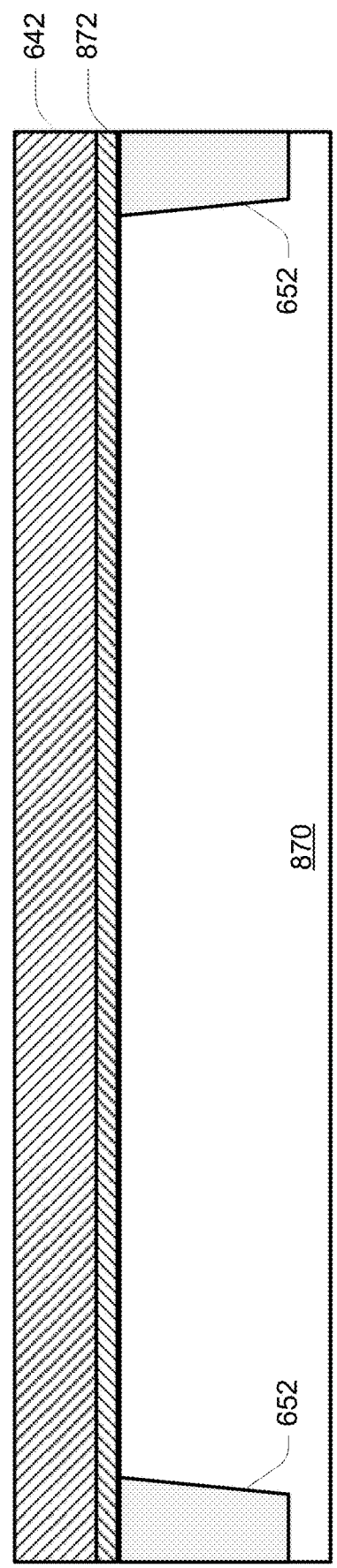

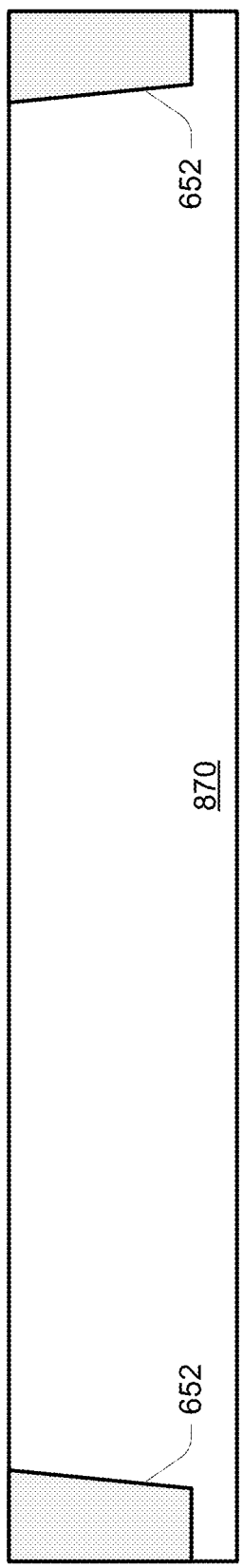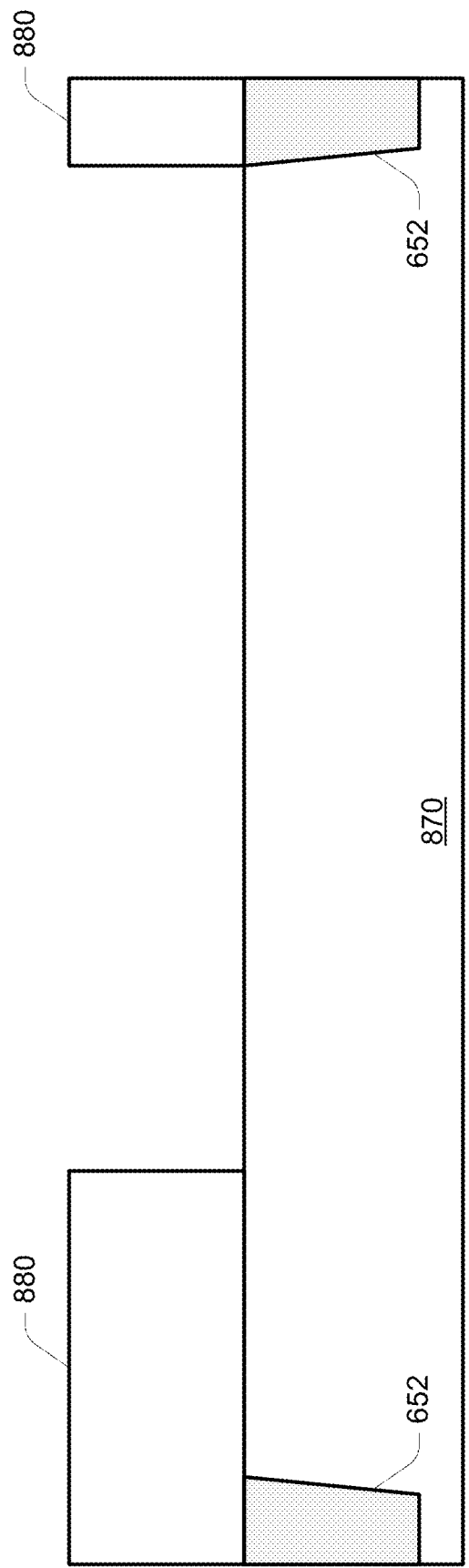
FIG. 10C
FIG. 10D

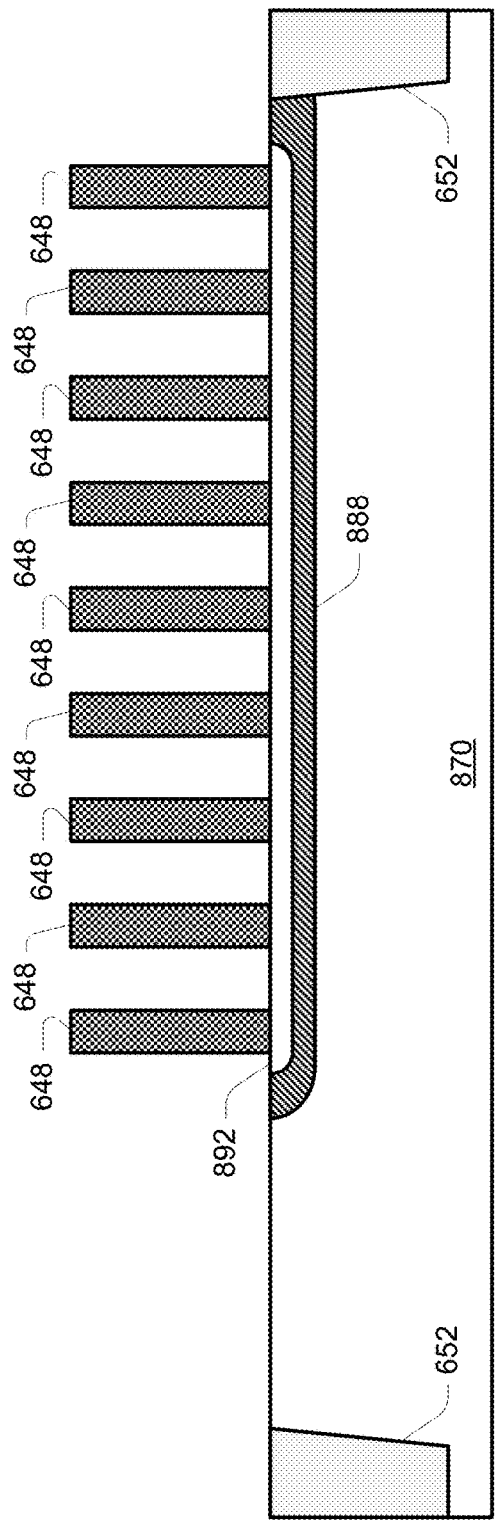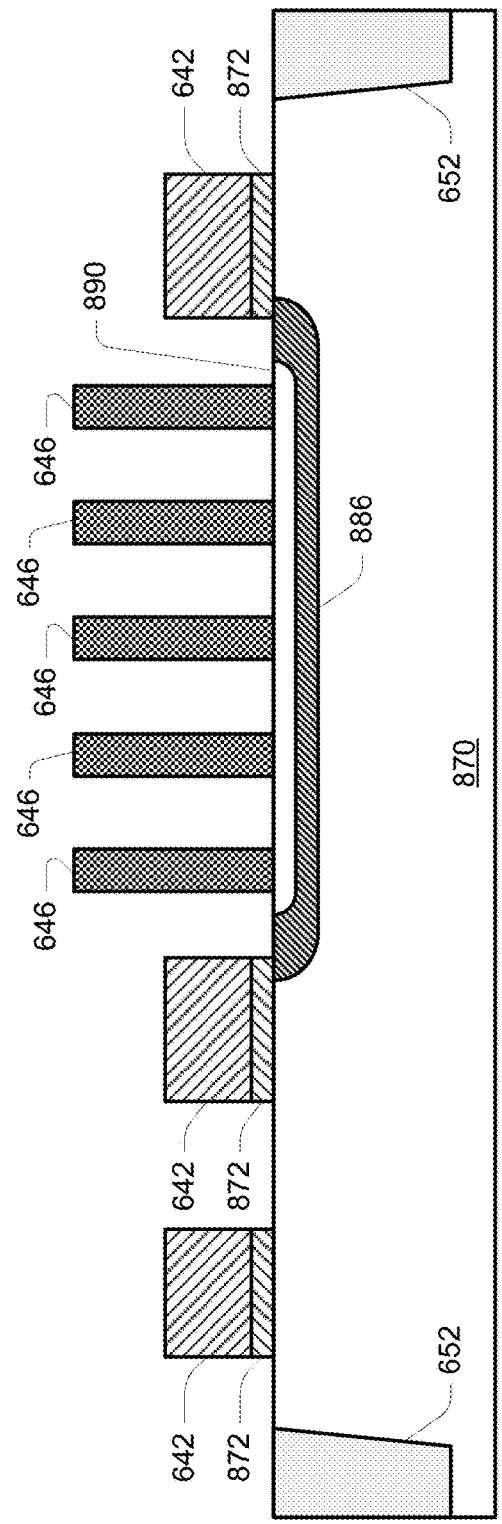

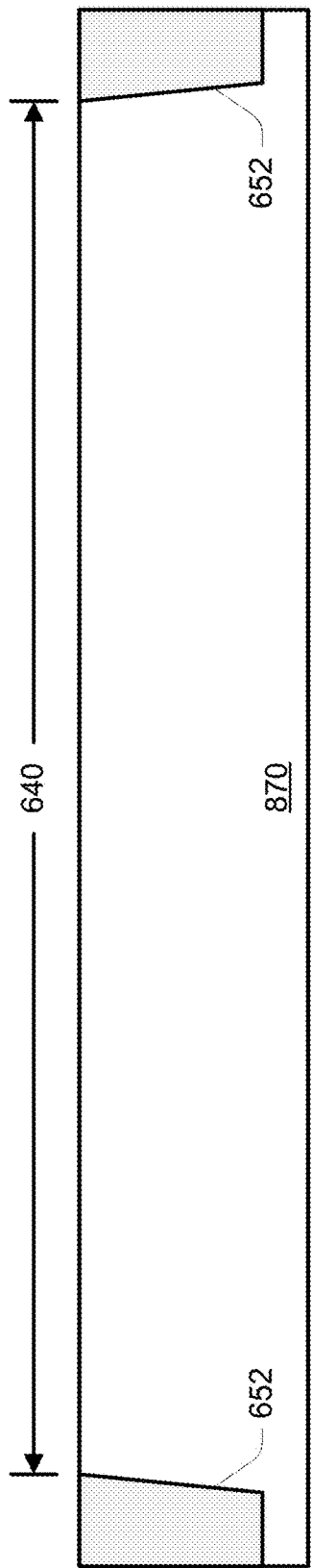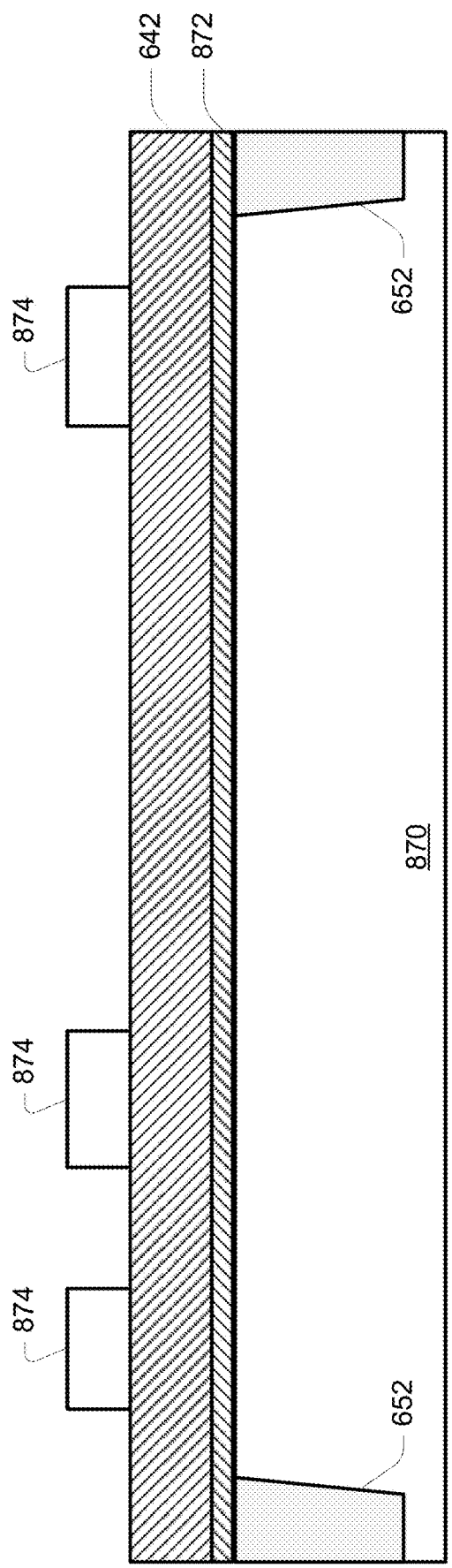

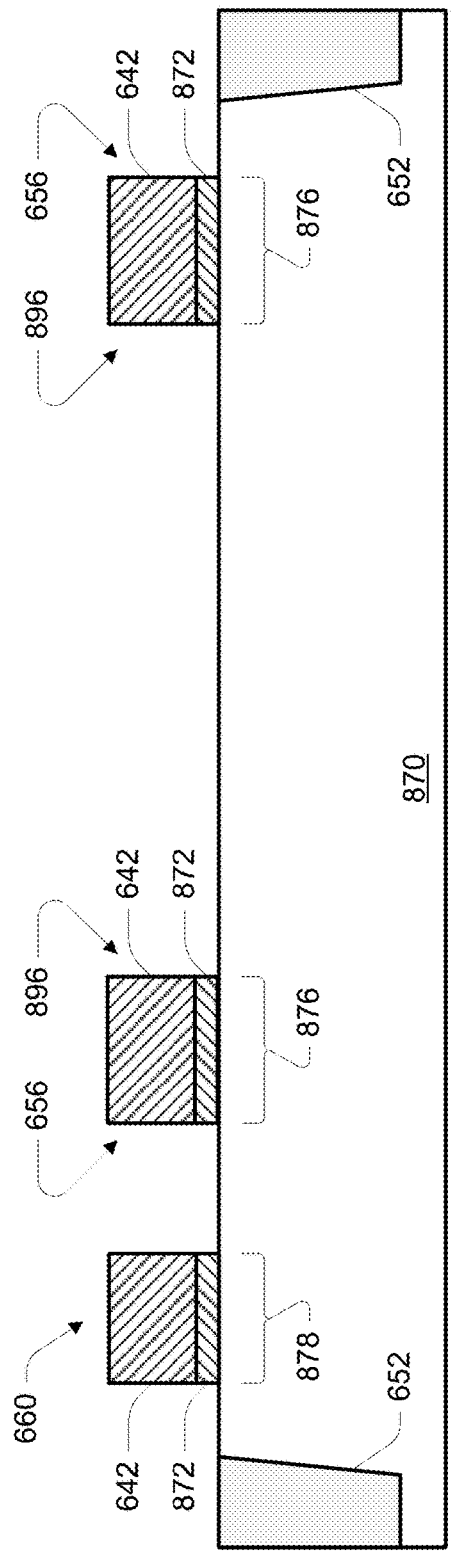
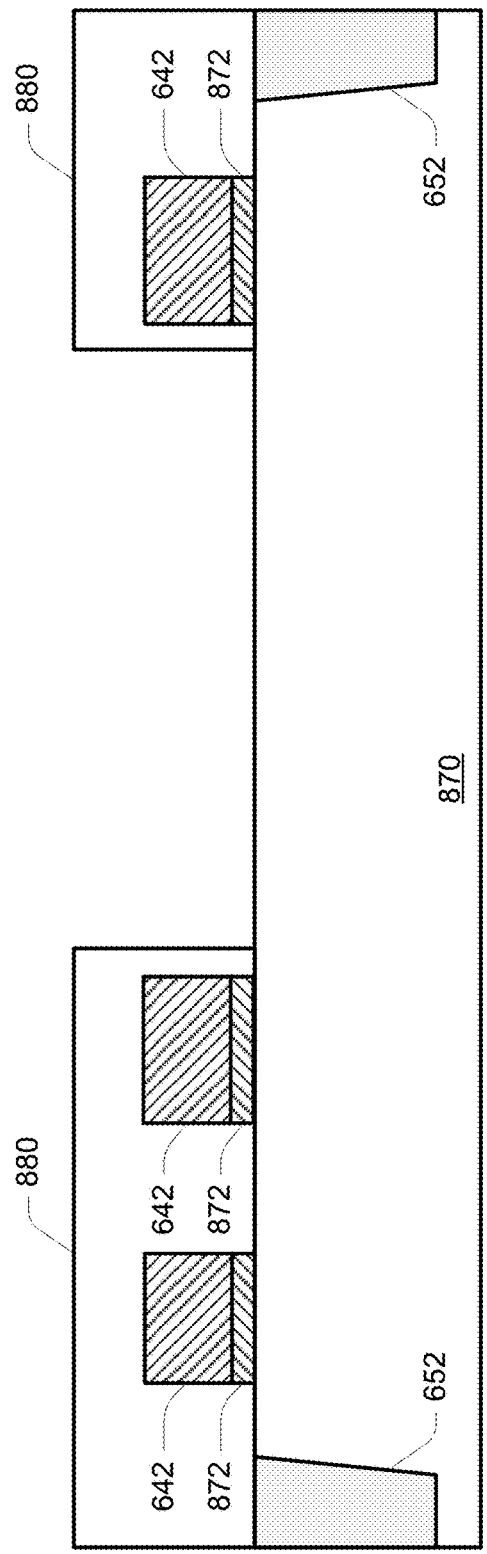
FIG. 11C
FIG. 11D

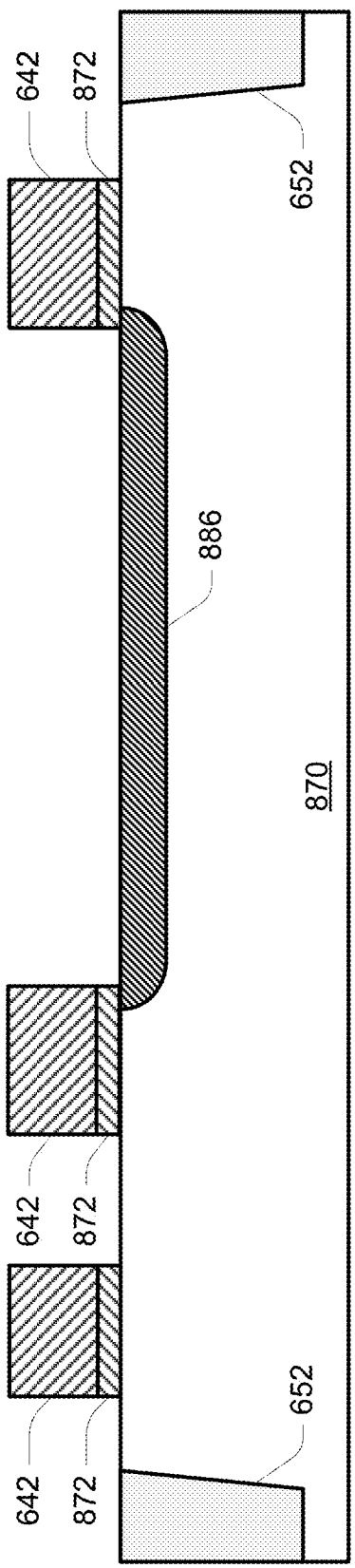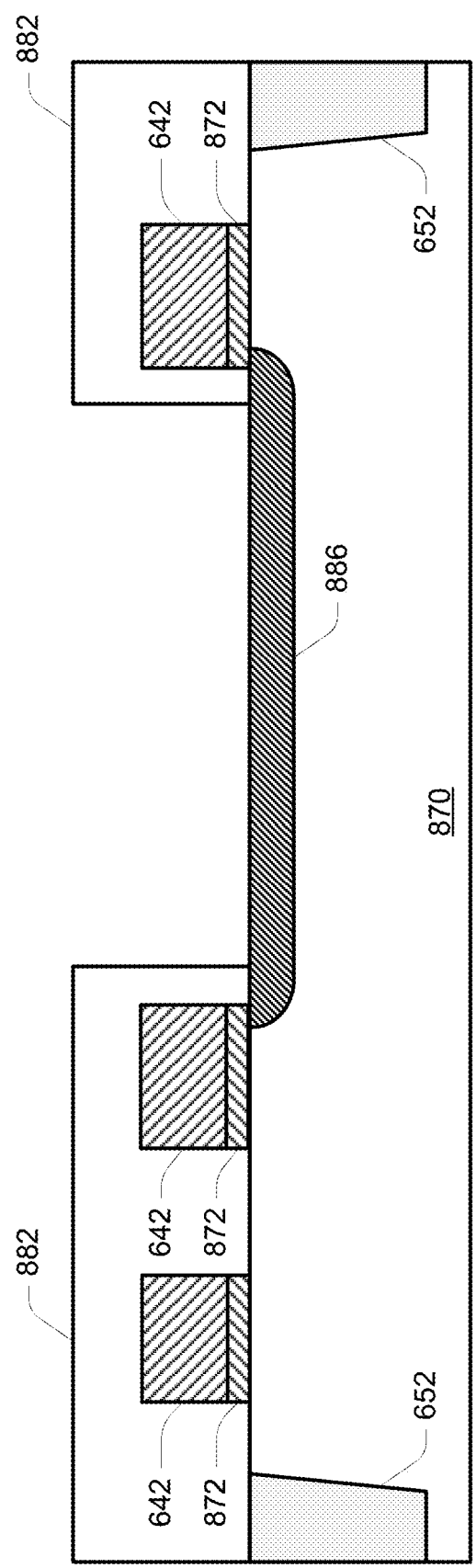

FIELD-EFFECT TRANSISTORS, DEVICES CONTAINING SUCH FIELD-EFFECT TRANSISTORS AND METHODS OF THEIR FORMATION

TECHNICAL FIELD

The present disclosure relates generally to integrated circuits, and, in particular, in one or more embodiments, the present disclosure relates to field-effect transistors, devices containing such field-effect transistors, and methods of their formation.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

Various operations of a memory are often performed in parallel, whether inputting a number of digits of data to the memory, programming a number of digits of data to an array of memory cells, reading a number of digits of data from the array of memory cells, and outputting a number of digits of data from the memory. Circuitry for performing such operations might be repeated, with one such circuit for each digit of data involved in the operation. These operations might be made more reliable if a circuit corresponding to one digit of data involved in an operation exhibited the same operating characteristics as each remaining circuit corresponding to the remaining digits of data involved in the operation. However, industrial variability can hinder this goal.

BRIEF DESCRIPTION OF THE DRAWINGS

FIGS. 6A-6C are top views of field-effect transistors in accordance with embodiments.

FIGS. 6D-6F depict spurs having various shapes in accordance with embodiments.

FIGS. 8A-8G are cross-sectional views of the field-effect transistor of FIG. 7 taken along line A-A at various stages of fabrication in accordance with an embodiment.

FIGS. 9A-9G are cross-sectional views of the field-effect transistor of FIG. 7 taken along line B-B at various stages of fabrication in accordance with an embodiment.

FIGS. 10A-10G are cross-sectional views of the field-effect transistor of FIG. 7 taken along line C-C or line C'-C' at various stages of fabrication in accordance with an embodiment.

FIGS. 11A-11G are cross-sectional views of the field-effect transistor of FIG. 7 taken along line D-D at various stages of fabrication in accordance with an embodiment.

DETAILED DESCRIPTION

Figure 1:
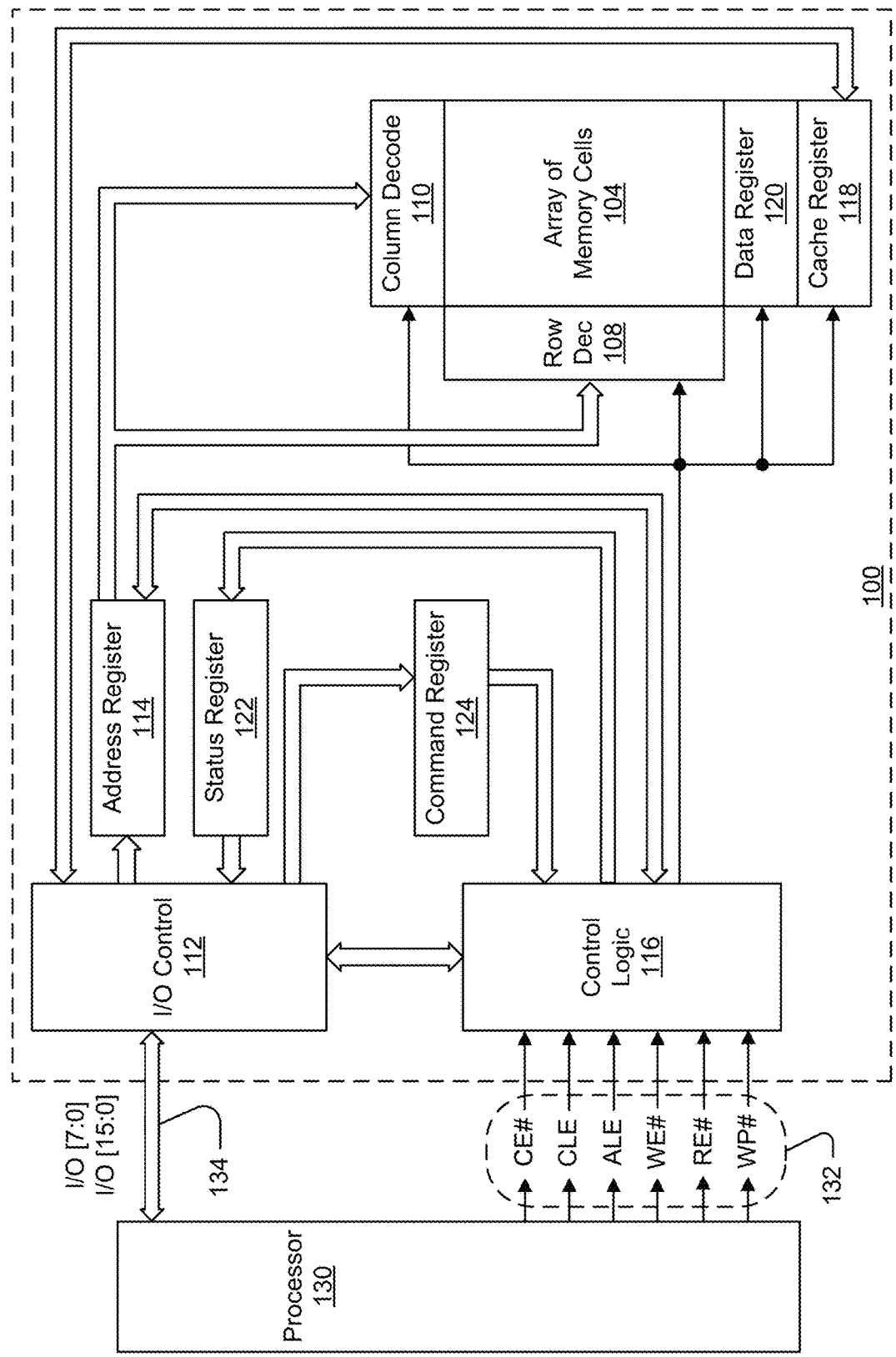
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments might be utilized and structural, logical and electrical changes might be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps might have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting by an electrically conductive path unless otherwise apparent from the context.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

Field-effect transistors are a fundamental circuit elements found in a variety of integrated circuit devices, e.g., memories, processors, application specific integrated circuits, etc. The operating characteristics of field-effect transistors can greatly affect the operation of an individual circuit or integrated circuit device. This can be especially true in devices where many circuits are operated in parallel and are expected to have the same behavior in response to the same inputs. Various embodiments herein seek to mitigate one or more sources of variability in the operating characteristics of certain transistor structures, which might facilitate improved functionality of matched circuits in integrated circuits in general, and, in particular, in memories.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 that might be logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and may generate status information for the external processor 130, i.e., control logic 116 is configured to perform access operations (e.g., sensing operations [which might include read operations and verify operations], programming operations and/or erase operations) on the array of memory cells 104. The control logic 116 is in communication with row decode circuitry 108 and column decode circuitry 110 to control the row decode circuitry 108 and column decode circuitry 110 in response to the addresses.

Control logic 116 might also be in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104, then new data might be latched in the cache register 118 from the I/O control circuitry 112. During a read operation, data might be passed from the cache register 118 to the I/O control circuitry 112 for output to the external processor 130, then new data might be passed from the data register 120 to the cache register 118. The cache register 118 and/or the data register 120 might form (e.g., might form a portion of) a page buffer of the memory device 100. A data register 120 might further include sense circuits (not shown in FIG. 1) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. For another embodiment, cache register 118 might be omitted, and the data might be written directly into data register 120. Data might also be output over input/output (I/O) pins [7:0] for an 8-bit device or input/output (I/O) pins [15:0] for a 16-bit device. Although reference might be made to I/O pins, they might include any conductive nodes providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 might not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) might be used in the various embodiments.

Figure 2A:
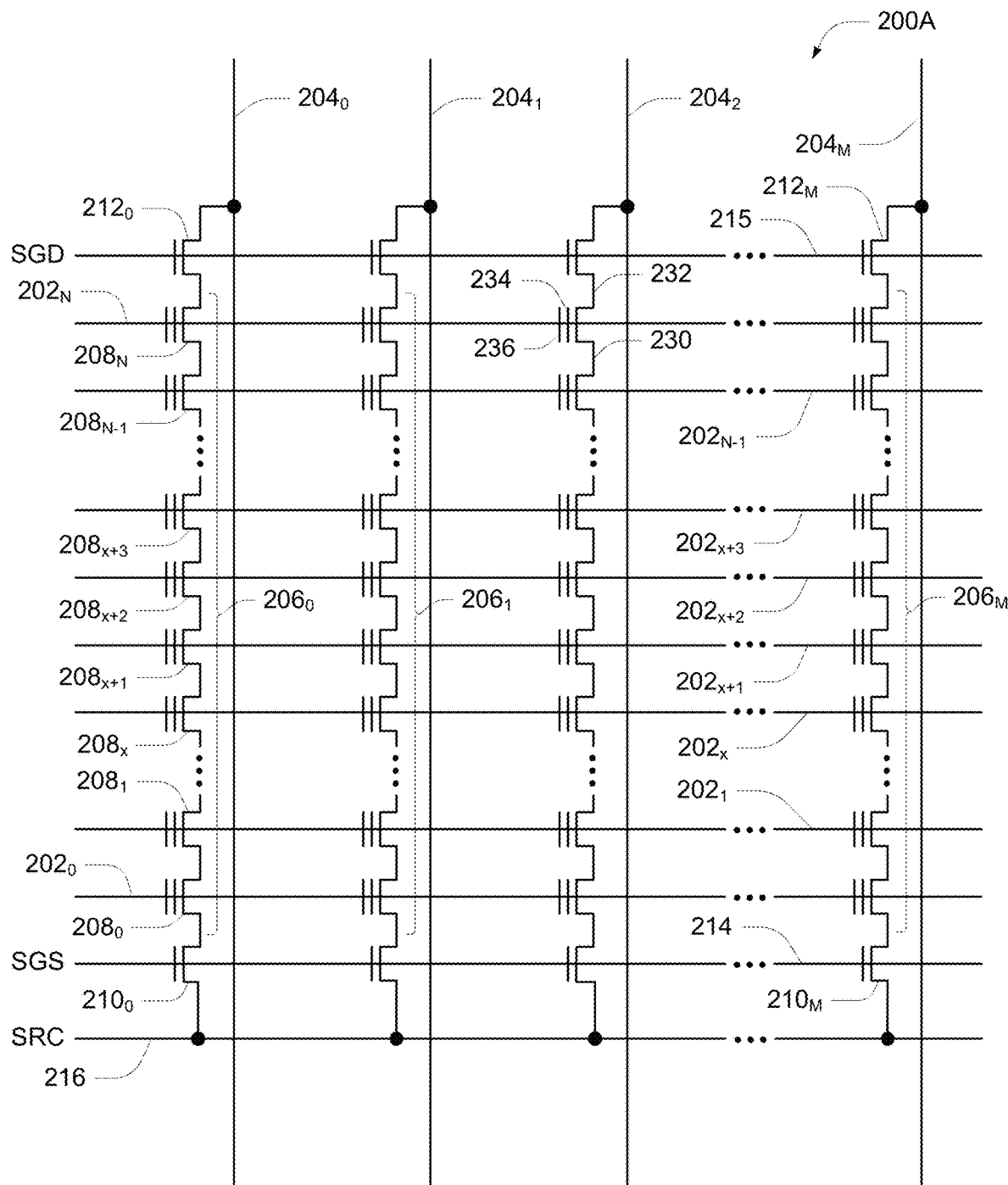
FIGS. 2A-2B are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines (e.g., word lines) $202_0$ to $202_N$, and data lines (e.g., bit lines) $204_0$ to $204_M$. The access lines 202 might be connected to global access lines (e.g., global word lines), not shown in FIG. 2A, in a many-to-one relationship. For some embodiments, memory array 200A might be formed over a semiconductor that, for example, might be conductively doped to have a conductivity type, such as a p-type conductivity, e.g., to form a p-well, or an n-type conductivity, e.g., to form an n-well.

Memory array 200A might be arranged in rows (each corresponding to an access line 202) and columns (each corresponding to a data line 204). Each column might include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 might represent non-volatile memory cells for storage of data. The memory cells $208_0$ to $208_N$ might include memory cells intended for storage of data, and might further include other memory cells not intended for storage of data, e.g., dummy memory cells. Dummy memory cells are typically not accessible to a user of the memory, and are instead typically incorporated into the string of series-connected memory cells for operational advantages that are well understood.

The memory cells 208 of each NAND string 206 might be connected in series between a select gate 210 (e.g., a field-effect transistor), such as one of the select gates $210_0$ to $210_M$ (e.g., that might be source select transistors, commonly referred to as select gate source), and a select gate 212 (e.g., a field-effect transistor), such as one of the select gates $212_0$ to $212_M$ (e.g., that might be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 might utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the data line 204 for the corresponding NAND string 206. For example, the drain of select gate $212_0$ might be connected to the data line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding data line 204. A control gate of each select gate 212 might be connected to select line 215.

The memory array in FIG. 2A might be a quasi-two-dimensional memory array and might have a generally planar structure, e.g., where the common source 216, NAND strings 206 and data lines 204 extend in substantially parallel planes. Alternatively, the memory array in FIG. 2A might be a three-dimensional memory array, e.g., where NAND strings 206 might extend substantially perpendicular to a plane containing the common source 216 and to a plane containing the data lines 204 that might be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 might include both conductive and dielectric structures while the control gate 236 is generally formed of one or more conductive materials. In some cases, memory cells 208 might further have a defined source/drain (e.g., source) 230 and a defined source/drain (e.g., drain) 232. Memory cells 208 have their control gates 236 connected to (and in some cases form) an access line 202.

A column of the memory cells 208 might be a NAND string 206 or a plurality of NAND strings 206 selectively connected to a given data line 204. A row of the memory cells 208 might be memory cells 208 commonly connected to a given access line 202. A row of memory cells 208 can, but need not, include all memory cells 208 commonly connected to a given access line 202. Rows of memory cells 208 might often be divided into one or more groups of physical pages of memory cells 208, and physical pages of memory cells 208 often include every other memory cell 208 commonly connected to a given access line 202. For example, memory cells 208 commonly connected to access line $202_N$ and selectively connected to even data lines 204 (e.g., data lines $204_0$, $204_2$, $204_4$, etc.) might be one physical page of memory cells 208 (e.g., even memory cells) while memory cells 208 commonly connected to access line $202_N$ and selectively connected to odd data lines 204 (e.g., data lines $204_1$, $204_3$, $204_5$, etc.) might be another physical page of memory cells 208 (e.g., odd memory cells). Although data lines $204_3$-$204_5$ are not explicitly depicted in FIG. 2A, it is apparent from the figure that the data lines 204 of the array of memory cells 200A might be numbered consecutively from data line $204_0$ to data line $204_M$. Other groupings of memory cells 208 commonly connected to a given access line 202 might also define a physical page of memory cells 208. For certain memory devices, all memory cells commonly connected to a given access line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells might include those memory cells that are configured to be erased together, such as all memory cells connected to access lines $202_0$-$202_N$ (e.g., all NAND strings 206 sharing common access lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
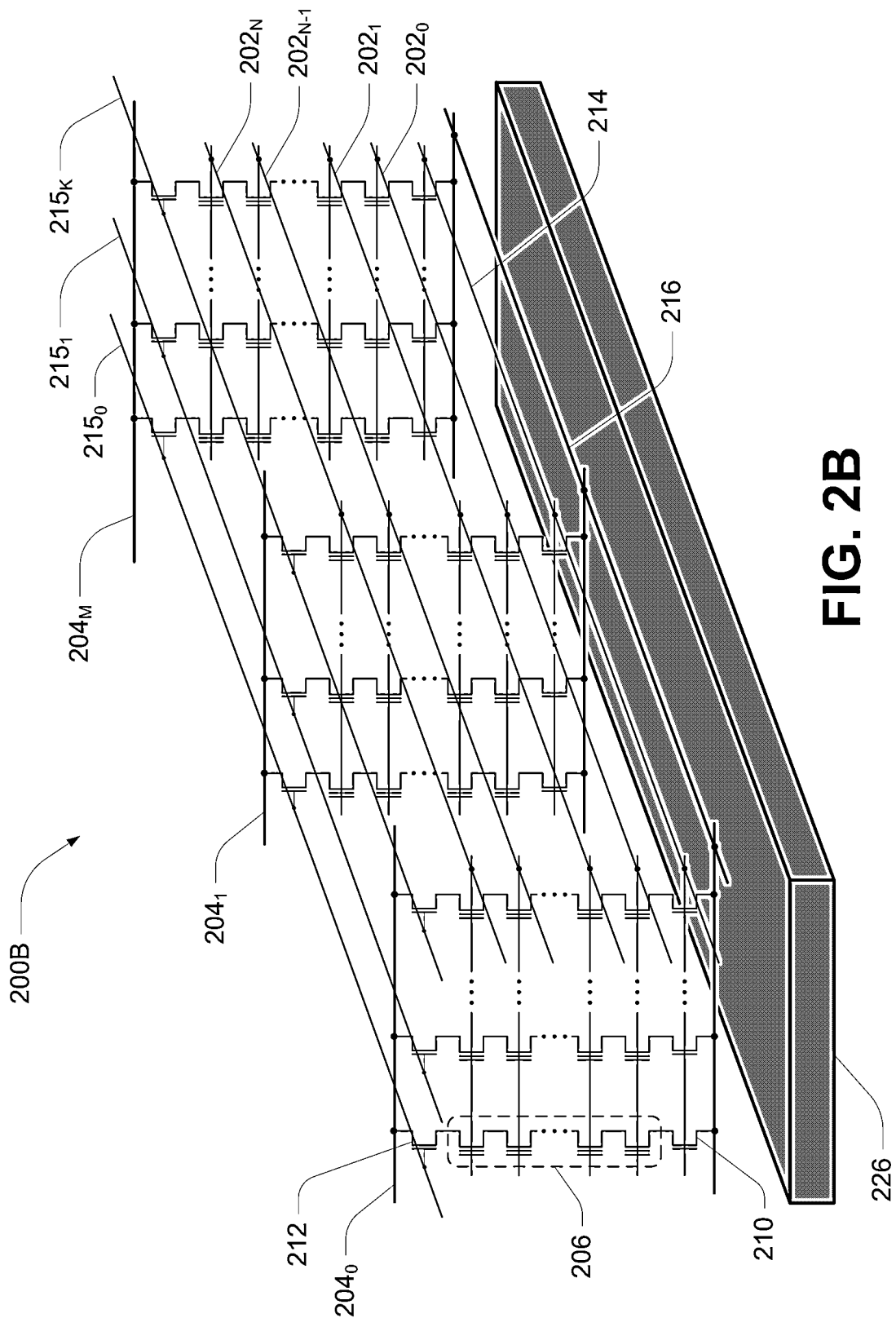

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B might incorporate vertical structures which might include semiconductor pillars where a portion of a pillar might act as a channel region of the memory cells of NAND strings 206, e.g., a region through which current might flow when a memory cell, e.g., a field-effect transistor, is activated. The NAND strings 206 might be each selectively connected to a data line $204_0$-$204_M$ by a select transistor 212 (e.g., that might be drain select transistors, commonly referred to as select gate drain) and to a common source 216 by a select transistor 210 (e.g., that might be source select transistors, commonly referred to as select gate source). Multiple NAND strings 206 might be selectively connected to the same data line 204. Subsets of NAND strings 206 can be connected to their respective data lines 204 by biasing the select lines $215_0$-$215_K$ to selectively activate particular select transistors 212 each between a NAND string 206 and a data line 204. The select transistors 210 can be activated by biasing the select line 214. Each access line 202 might be connected to multiple rows of memory cells of the memory array 200B. Rows of memory cells that are commonly connected to each other by a particular access line 202 might collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include complementary circuit elements. For example, the peripheral circuitry 226 might include both n-channel region and p-channel region transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

The peripheral circuitry 226 might include circuitry that could incorporate field-effect transistors in accordance with embodiments. For example, the peripheral circuitry 226 might include I/O buffers used in the input and output of data to and from the memory, voltage regulators used in the development of programming voltages or other voltages used by the memory, comparators or differential amplifiers used in voltage regulators and elsewhere, and sense circuits for determining a data state of a memory cell. A memory might incorporate a field-effect transistor in accordance with an embodiment in one or more such circuits used in accessing the memory array. Although not necessary for an understanding of the disclosed transistor structures, example I/O buffers might be found with reference to U.S. Pat. No. 10,819,296 to Maccarrone et al., example voltage regulators might be found with reference to U.S. Pat. No. 10,388,382 to Guo et al., example comparators and differential amplifiers might be found with reference to U.S. Pat. No. 8,258,816 to Forbes, and example sense circuits might be found with reference to U.S. Pat. No. 10,127,988 to Vu et al.

Figure 3:
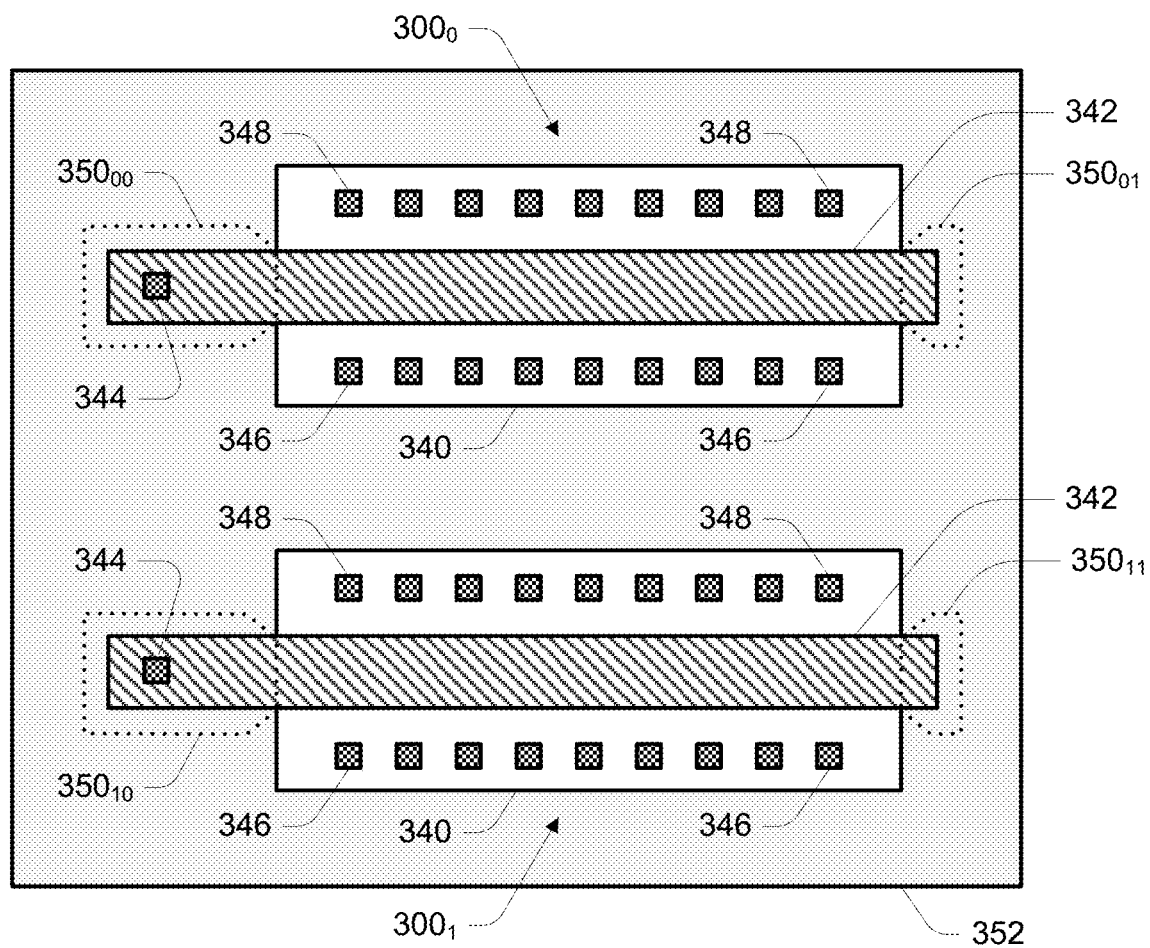
FIG. 3 is a top view of a matched pair of field-effect transistors of the related art.

FIG. 3 is a top view of a matched pair of field-effect transistors of the related art. Depicted in FIG. 3 is a first field-effect transistor $300_0$ and a second field-effect transistor $300_1$. Each field-effect transistor 300 is formed in an active area 340. Each field-effect transistor 300 includes a conductor 342 forming a control gate of the field-effect transistor, a gate contact 344 for connection of the conductor 342 to a voltage source, one or more first source/drain contacts 346 for connection to a first source/drain region of the field-effect transistor, and one or more second source/drain contacts 348 for connection to a second source/drain region of the field-effect transistor.

The conductor 342 of the first field-effect transistor $300_0$ includes a first spur $350_{00}$ extending past its active area 340 and over an isolation region 352. The first spur $350_{00}$ is depicted to be connected to its gate contact 344. The conductor 342 of the first field-effect transistor $300_0$ further includes a second spur $350_{01}$ extending past its active area 340 and over the isolation region 352 at an opposite end of the conductor 342. Similarly, the conductor 342 of the second field-effect transistor $300_1$ includes a first spur $350_{10}$ extending past its active area 340 and over the isolation region 352. The first spur $350_{10}$ is depicted to be connected to its gate contact 344. The conductor 342 of the second field-effect transistor $300_1$ further includes a second spur $350_{11}$ extending past its active area 340 and over the isolation region 352 at an opposite end of the conductor 342.

While the field-effect transistors $300_0$ and $300_1$ might be designed to be the same, in reality they would likely be different in several respects due to industrial variability. For example, an interface between the isolation region 352 and an active region 340, especially near a channel region of a field-effect transistor 300, might exhibit differing contours which could affect operating characteristics. In addition, use of a high-K gate dielectric (not depicted in FIG. 3) between the conductor 342 and the active area 340 might lead to differing levels of oxygen contamination and diffusion into the channel region of a field-effect transistor 300 as the high-K dielectric transitions from an area overlying the isolation region 352 to an area overlying the active region 340. Such oxygen contamination and diffusion into the channel region could also affect the operating characteristics of a field-effect transistor 300. High-K dielectrics are generally defined as dielectric materials having a dielectric constant higher than the dielectric constant of silicon dioxide, e.g., higher than 3.9.

Figure 4:
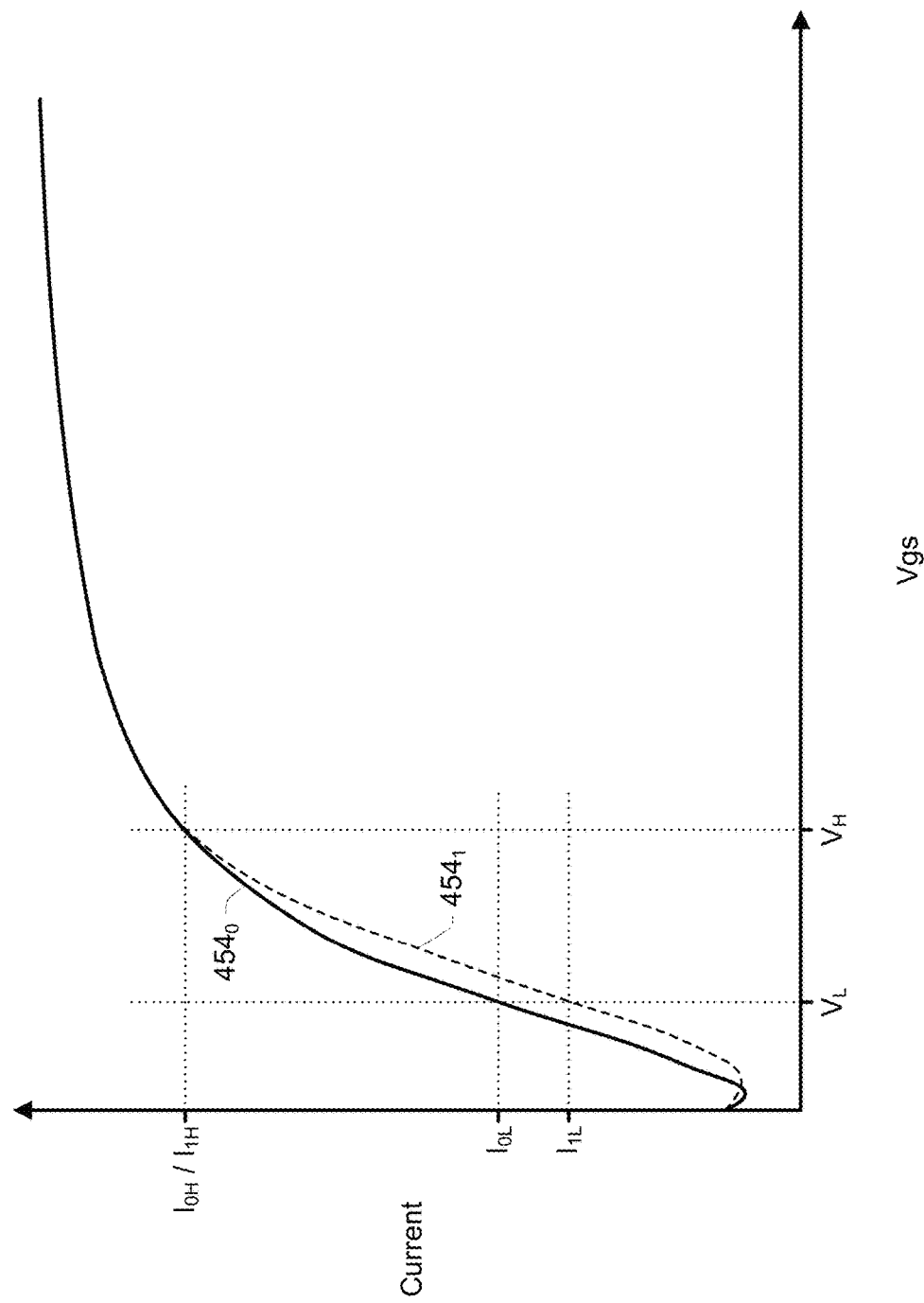
FIG. 4 depicts how operating characteristics of the matched pair of field-effect transistors of FIG. 3 might differ.

FIG. 4 depicts how operating characteristics of the matched pair of field-effect transistors 300 of FIG. 3 might differ. FIG. 4 might represent a plot of current passed by the field-effect transistors 300 as a function of the gate-source voltage (Vgs). The trace $454_0$ might correspond to the operating characteristics of the field-effect transistor $300_0$ and the trace $454_1$ might correspond to the operating characteristics of the field-effect transistor $300_1$. As depicted in FIG. 4, variability between the matched pair of field-effect transistors $300_0$ and $300_1$ as described can result in differing levels of current being passed, especially at lower gate-source voltages. For example, current passed by the first field-effect transistor $300_0$ at the gate-source voltage $V_H$, e.g., the current level $I_{OH}$, might be substantially equal to the current passed by the second field-effect transistor $300_1$ at the gate-source voltage $V_H$, e.g., the current level $I_{1H}$. However, current passed by the first field-effect transistor $300_0$ at the gate-source voltage $V_L$, e.g., the current level $I_{OL}$, might be significantly different than the current passed by the second field-effect transistor $300_1$ at the gate-source voltage $V_L$, e.g., the current level $I_{1L}$.

Figure 5A:
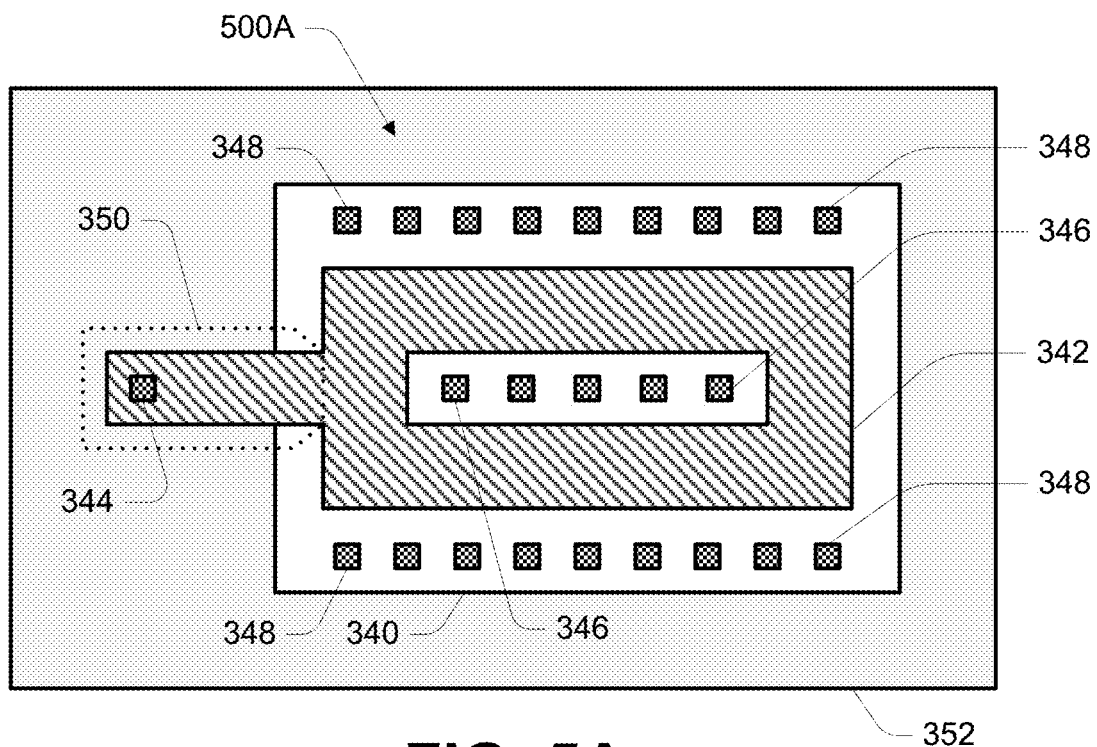
FIG. 5A-5B are top views of additional field-effect transistors of the related art.
Figure 5B:
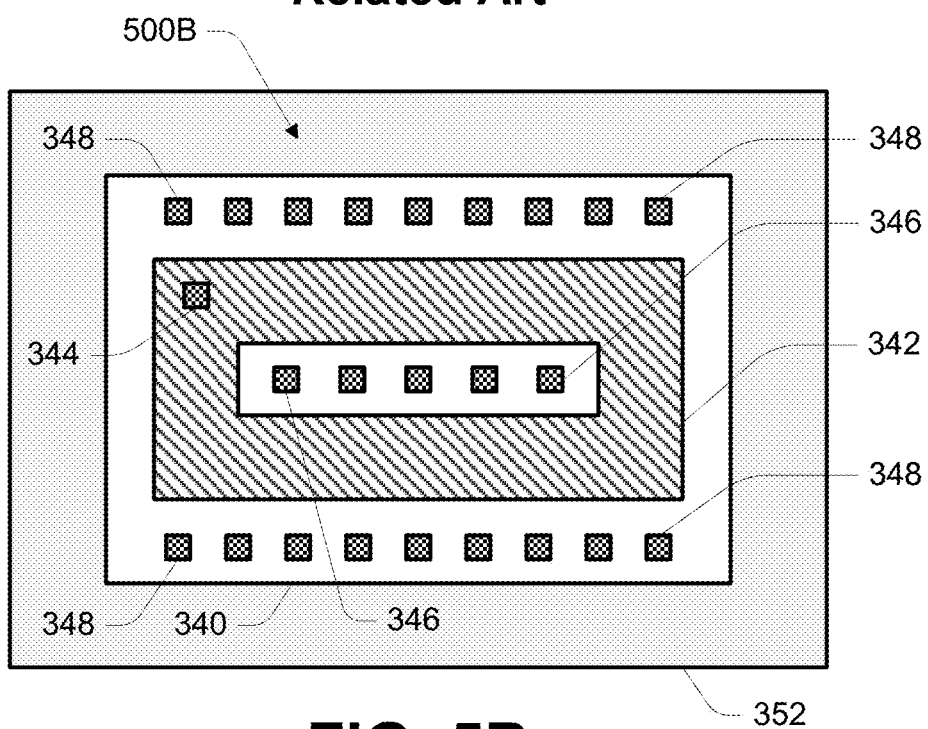

To mitigate issues of variability at the interface between an isolation region and an active area, the structure of FIG. 3 might be replaced with a so-called donut device, e.g., a field-effect transistor having a channel region formed in a ring shape around one source/drain region, with the other source/drain region formed outside the ring. FIG. 5A-5B are top views of additional field-effect transistors of the related art incorporating such a structure. Like numbered elements in FIGS. 5A-5B correspond to the description as provided with respect to FIG. 3.

FIG. 5A depicts a field-effect transistor 500A formed in an active area 340. The field-effect transistor 500A includes a conductor 342 forming a control gate of the field-effect transistor, a gate contact 344 for connection of the conductor 342 to a voltage source, one or more first source/drain contacts 346 for connection to a first source/drain region of the field-effect transistor, and one or more second source/drain contacts 348 for connection to a second source/drain region of the field-effect transistor. The conductor 342 of the field-effect transistor 500A includes a spur 350 extending past its active area 340 and over an isolation region 352. The spur 350 is depicted to be connected to its gate contact 344. In a structure of the type depicted in FIG. 5A, the channel region of the field-effect transistor 500A might be found only under that portion of the conductor 342 that does not form a portion of the spur 350. Because the channel region of the field-effect transistor 500A does not extend to the interface between the active area 340 and the isolation region 352, variability at the interface may have little impact on the operating characteristics of the field-effect transistor 500A. However, oxygen contamination and diffusion into the channel region caused by the transition of the spur 350 from an area overlying the isolation region 352 to an area overlying the active area 340 might impact the operating characteristics of the field-effect transistor 500A.

FIG. 5B depicts a field-effect transistor 500B formed in an active area 340. The field-effect transistor 500B includes a conductor 342 forming a control gate of the field-effect transistor, a gate contact 344 for connection of the conductor 342 to a voltage source, one or more first source/drain contacts 346 for connection to a first source/drain region of the field-effect transistor, and one or more second source/drain contacts 348 for connection to a second source/drain region of the field-effect transistor. The conductor 342 of the field-effect transistor 500B does not include any portion extending past its active area 340 and over an isolation region 352. Instead, gate contact 344 might be formed in a portion of the conductor 342 overlying a channel region of the field-effect transistor 500B. Like the field-effect transistor 500A, the channel region of the field-effect transistor 500B does not extend to the interface between the active area 340 and the isolation region 352, such that variability at the interface may have little or no impact on the operating characteristics of the field-effect transistor 500B. However, forming a gate contact 344 overlying the channel region might introduce variability impacting the operating characteristics of such field-effect transistors. For example, forming a gate contact 344 often includes conductive doping (e.g., additional conductive doping) in a silicon-containing conductor 342, and differing levels of conductive doping in conductors 342 of different field-effect transistors of the structure depicted in FIG. 5B might impact the operating characteristics of such field-effect transistors.

Figure 6A:
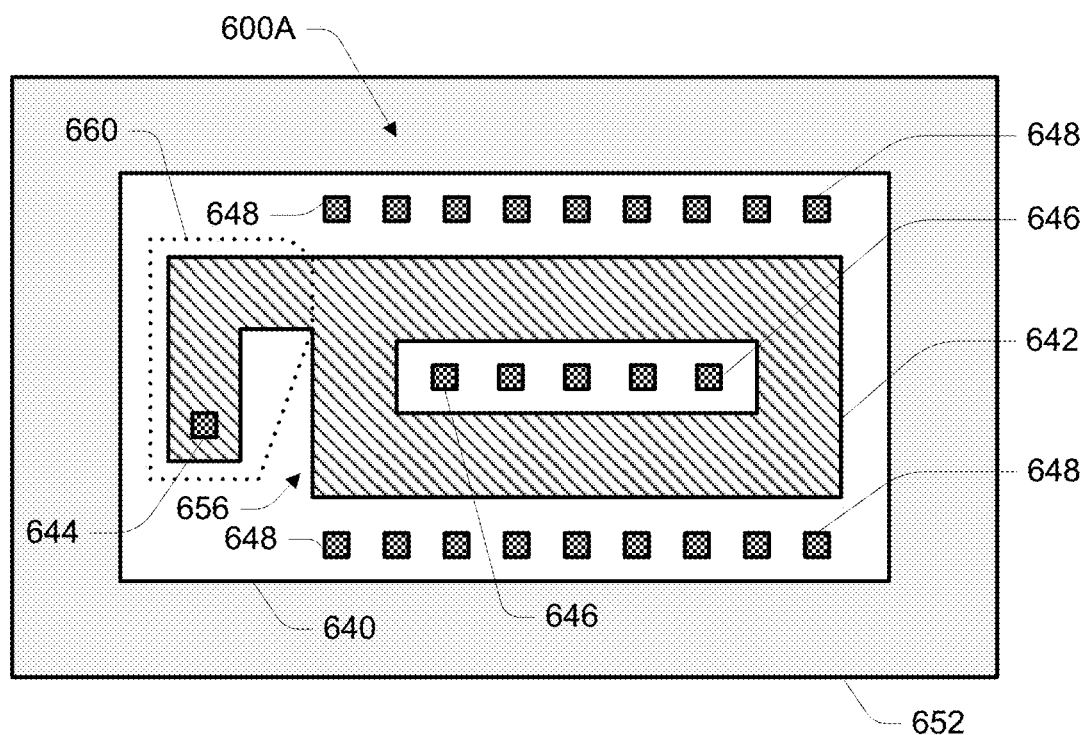
Figure 6B:
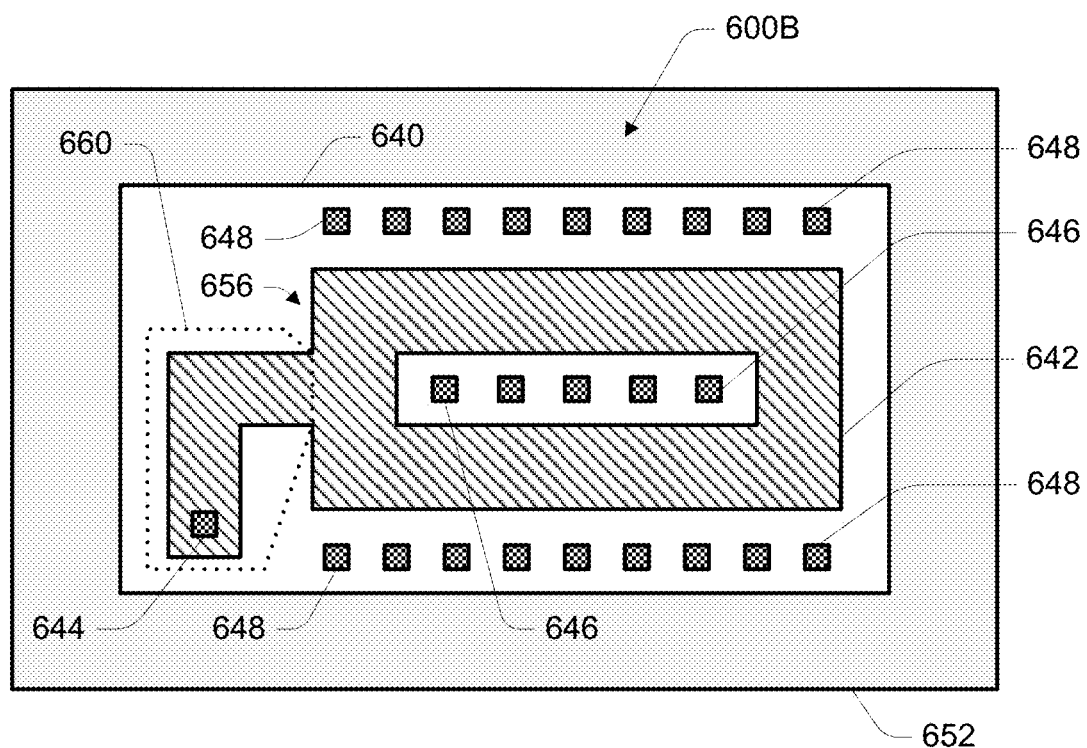

Various embodiments seek to mitigate issues identified in prior field-effect transistors structures. Field-effect transistors in accordance with embodiments include spurs of the conductors forming their control gates that do no overlie the isolation region. This permits placement of the gate contact outside of the channel region, and further avoids issues arising from a portion of the conductor overlying an isolation region and another portion overlying the active area. FIGS. 6A-6C are top views of field-effect transistors in accordance with various embodiments.

FIG. 6A depicts a field-effect transistor 600A formed in an active area 640. The field-effect transistor 600A includes a conductor 642 forming a control gate of the field-effect transistor, a gate contact 644 for connection of the conductor 642 to a voltage source, one or more first source/drain contacts 646 for connection to a first source/drain region of the field-effect transistor, and one or more second source/drain contacts 648 for connection to a second source/drain region of the field-effect transistor. The conductor 642 of the field-effect transistor 600A includes a spur 660 overlying (e.g., wholly overlying) the active area 640. In other words, the entirety of the conductor 642 might be overlying the active area 640. The spur 660 might be referred to as a spur portion of the conductor 642 extending from an annular portion of the conductor 642. The spur 660 is depicted to be connected to its gate contact 644. In a structure of the type depicted in FIG. 6A, the channel region of the field-effect transistor 600A might be found only under that portion (e.g., annular portion) of the conductor 642 that does not form a portion of the spur 660. As used herein, a channel region of a field-effect transistor will be that portion of an active area that is underlying a control gate of the field-effect transistor, and that is located between a first source/drain region of the field-effect transistor and a second source/drain region of the field-effect transistor. In general, the channel region of a field-effect transistor provides a path for current flow between the first source/drain region of the field-effect transistor and the second source/drain region of the field-effect transistor.

Because the channel region of the field-effect transistor 600A does not extend to the interface between the active area 640 and the isolation region 652, variability at the interface might have little to no impact on the operating characteristics of the field-effect transistor 600A. In addition, with the spur 660 devoid of any portion overlying the isolation region 652 adjacent to the active area 640, oxygen contamination and diffusion into the channel region caused by a transition of a gate dielectric from the isolation region 652 to the active area 640 might not be a concern. Furthermore, with the gate contact 644 formed in the spur 660, away from the channel region of the field-effect transistor 660, any variability caused by the formation of the gate contact 644 might not be a concern.

In FIG. 6A, a distance between the gate contact 644 and the channel region of the field-effect transistor 600A (e.g., a shortest current path from the gate contact 644 to a portion of the conductor 642 overlying the channel region) might be selected such that any diffusion of conductive doping for the gate contact 644 would not be expected to reach the channel region, and/or that any other variability caused by the formation of the gate contact 644 in contact with the conductor 642 would not be expected to affect the channel region. In addition, a cross-section of the conductor 642 might be sized such that a resistance of the spur 660 is sufficiently low to facilitate effective operation of the field-effect transistor 600A. While the portion of the conductor 642 overlying the channel region of the field-effect transistor 600A is depicted to be a rectangular annulus, other regular or irregular annular shapes capable of surrounding the first source/drain contacts 646 of the field-effect transistor 600A are possible. For example, the portion of the conductor 642 forming an annular shape might be circular, oval, square, polygonal, etc.

The spur 660 might extend from an outer perimeter 656 of an annular portion of the conductor 642, e.g., that portion of the conductor 642 overlying a channel region of the field-effect transistor 600A. For example, the spur 660 might extend from a portion of the outer perimeter 656 of the conductor 642 that generally runs along a length of the field-effect transistor 600A.

FIGS. 6B and 6C depict field-effect transistors 600B and 600C, respectively. Like numbered elements in FIGS. 6B and 6C correspond to the description as provided with respect to FIG. 6A. The description of field-effect transistors 600B and 600C generally follows the description of field-effect transistor 600A, but differ by the nature of their respective spurs 660. For example, the field-effect transistor 600B demonstrates that the spur 660 might be formed anywhere along the outer perimeter 656 of that portion of the conductor 642 overlying a channel region of the field-effect transistor. For example, the spur 660 of the field-effect transistor 600A extends from one end of an edge of the outer perimeter 656, while the spur 660 of the field-effect transistor 600B extends from a mid-point of the edge of the outer perimeter 656. Similarly, the field-effect transistor 600C demonstrates that the spur 660 might have any shape that places the gate contact 644 overlying (e.g., solely overlying) the active area 640 and spaced apart from the channel region of the field-effect transistor. In the example of FIG. 6C, the spur 660 of the field-effect transistor 600C is straight, e.g., it contains no bend or other change in direction after extending from the outer perimeter 656. In contrast, the spurs 660 of the field-effect transistors 600A and 600B each contain a first portion extending from the outer perimeter 656 of the annular portion of the conductor 642 in a first direction, and a second portion extending from the first portion in a second direction different than the first direction, e.g., forming an L-shape. In the depicted examples, the first portion is shorter than the second portion, but the first portion could be longer than the second portion, or the two portions could be equal in length. Similarly, while the second direction is depicted to be orthogonal to the first direction, other angles could also be used. Furthermore, a spur 660 could have portions extending in more than two different directions.

FIGS. 6D-6F depict spurs 660 having additional shapes in accordance with embodiments. For clarity, the annular portion of the conductor 642 is not depicted in FIGS. 6D-6F.

FIG. 6D depicts a spur 660 having a first portion extending in a first direction D1, and a second portion extending in a second direction D2. In contrast with the example of FIG. 6A, the first direction is non-orthogonal to the second direction. Although the gate contact 644 is depicted to be connected to the second portion of the spur 660, e.g., with the first portion of the spur 660 extending from the annular portion (not depicted in FIG. 6D) of a conductor, the gate contact 644 could alternatively be connected to the first portion of the spur 660 with the second portion of the spur 660 connected to the annular portion of the conductor.

FIG. 6E depicts a spur 660 having a first portion extending in a first direction D1, a second portion extending in a second direction D2, and a third portion extending in a third direction D3. In the example of FIG. 6E, the first direction D1 is non-orthogonal to the second direction D2, and the third direction D3 is non-orthogonal to the second direction D2. Although the third direction D3 is depicted to be orthogonal to the first direction D1, it need not be. Similarly, although the gate contact 644 is depicted to be connected to the third portion of the spur 660, e.g., with the first portion of the spur 660 extending from the annular portion (not depicted in FIG. 6E) of a conductor, the gate contact 644 could alternatively be connected to the first portion of the spur 660 with the third portion of the spur 660 connected to the annular portion of the conductor.

While the examples of FIGS. 6A, 6B, 6D and 6E depict spurs 660 having portions connected in an angular fashion, various portions of a spur 660 might instead be connected in a curvilinear fashion. FIG. 6F depicts a spur 660 having a first portion extending in a first direction D1 and a second portion extending in a second direction D2 that are connected in a curvilinear fashion.

Figure 7:
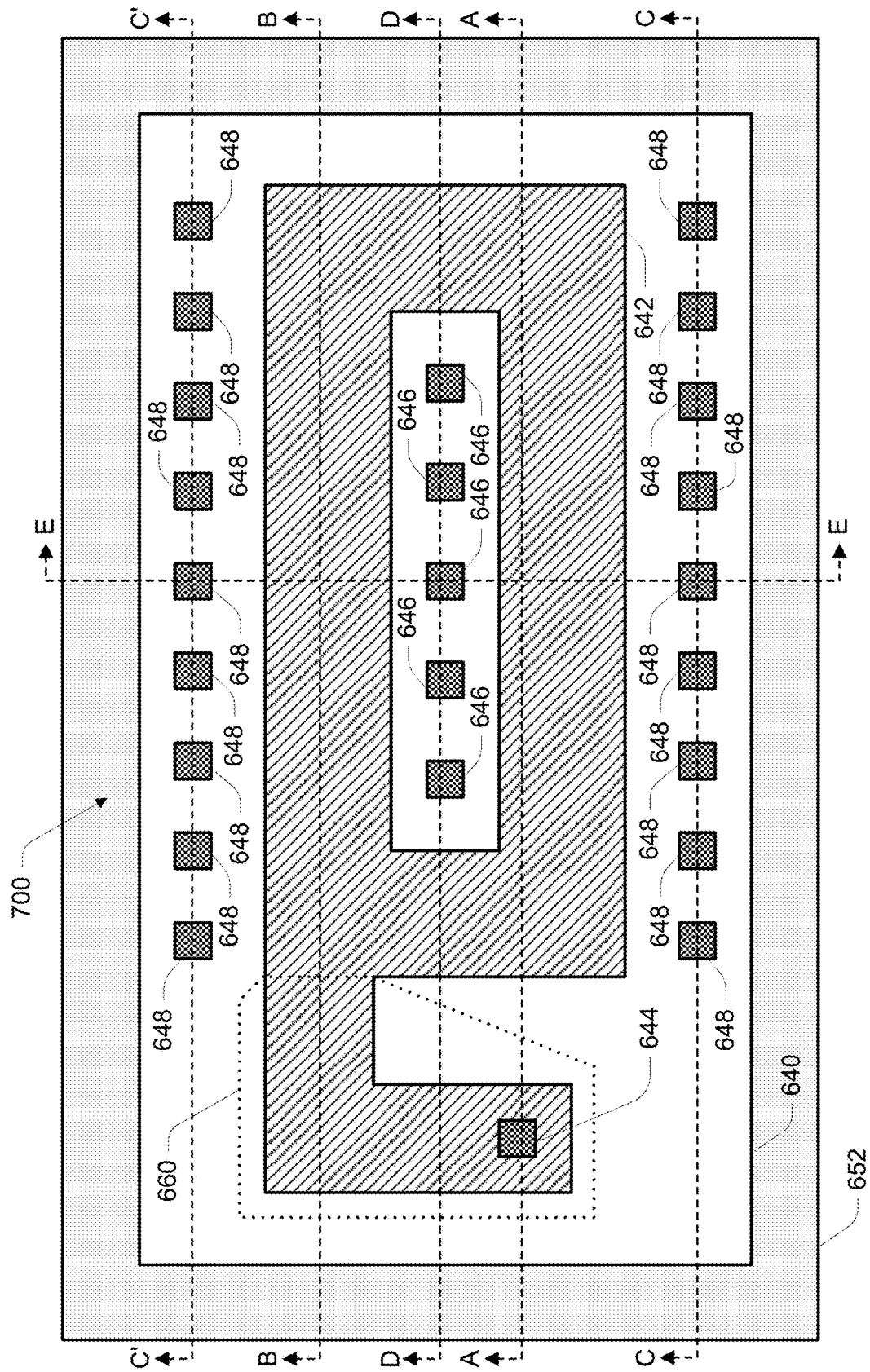
FIG. 7 is a top view of a field-effect transistor in accordance with an embodiment for use in discussing FIGS. 8A-8G, 9A-9G, 10A-10G, 11A-11G and 12A-12G.
Figure 8E:
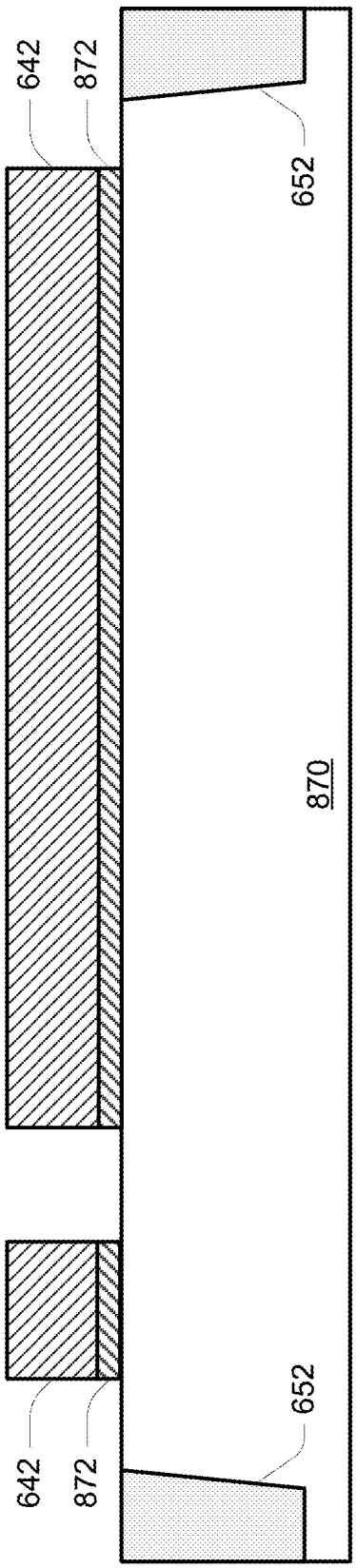
Figure 8F:
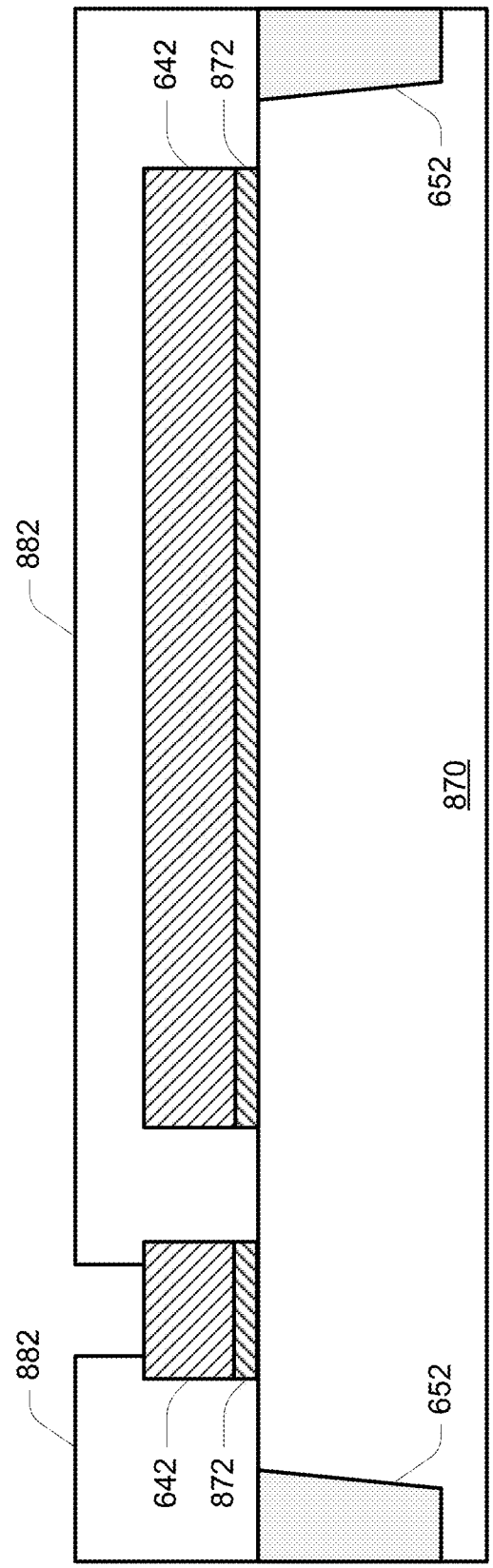
Figure 8G:
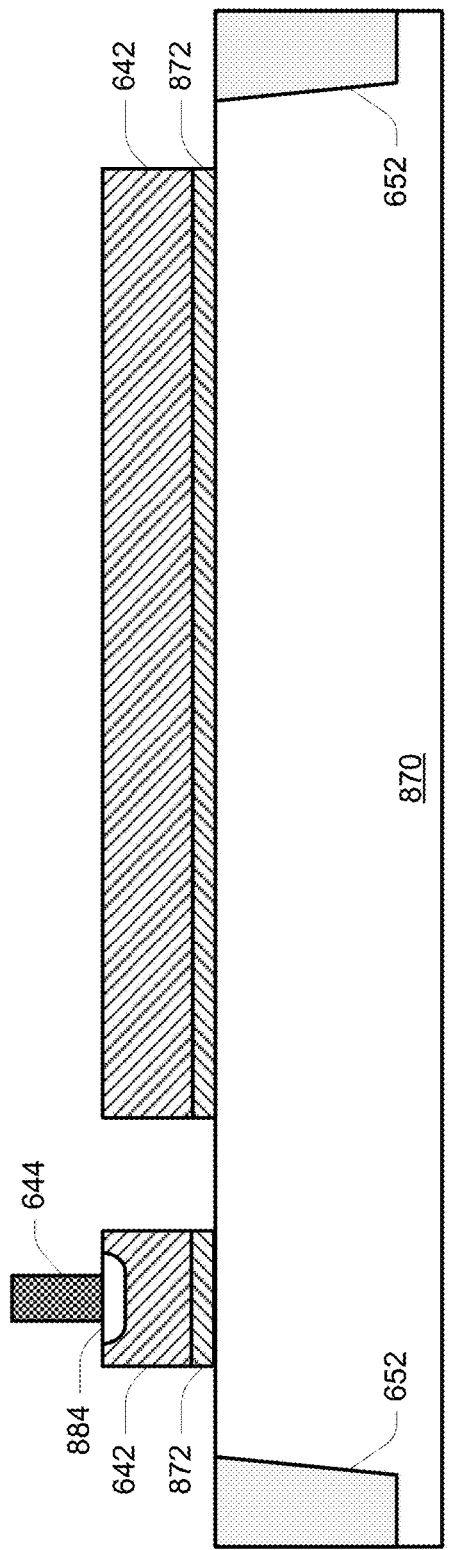
Figure 9G:
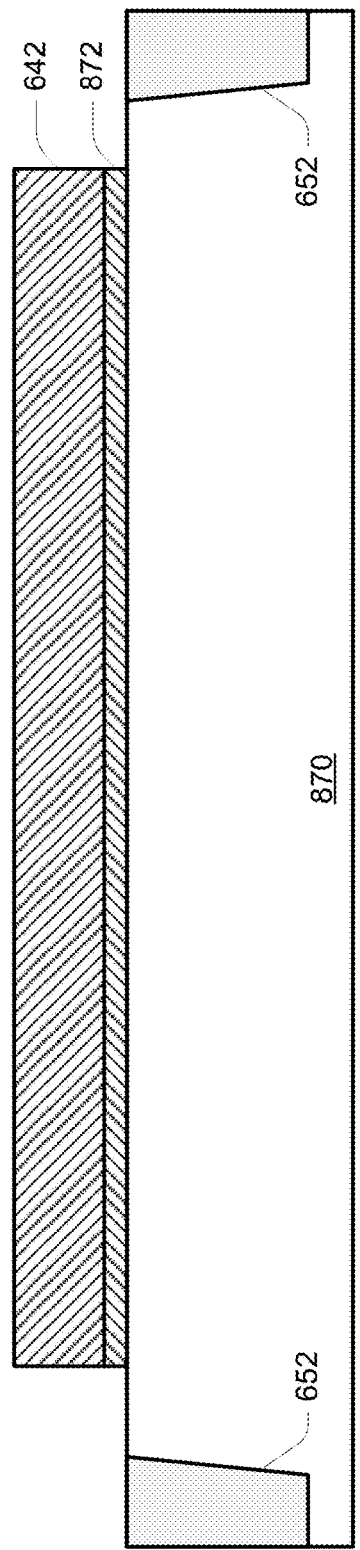
Figure 9A:
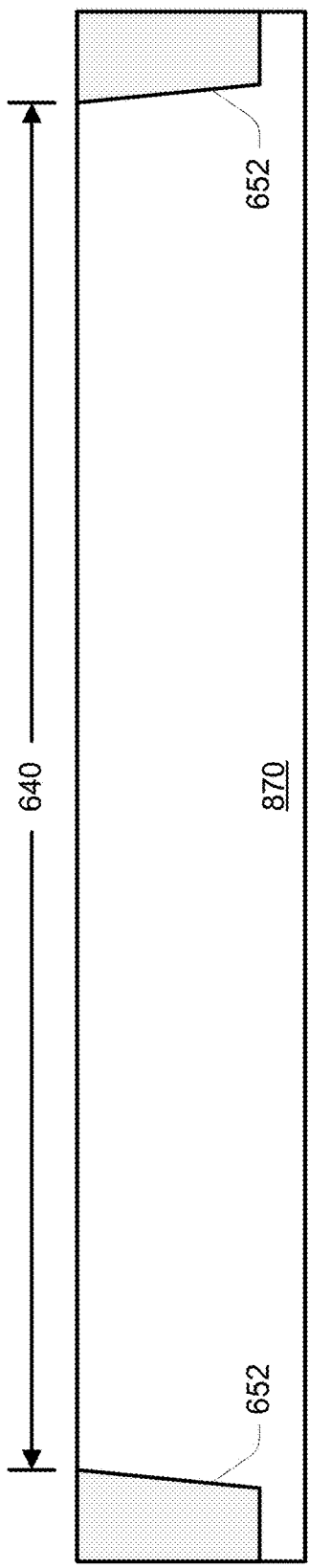
Figure 9B:
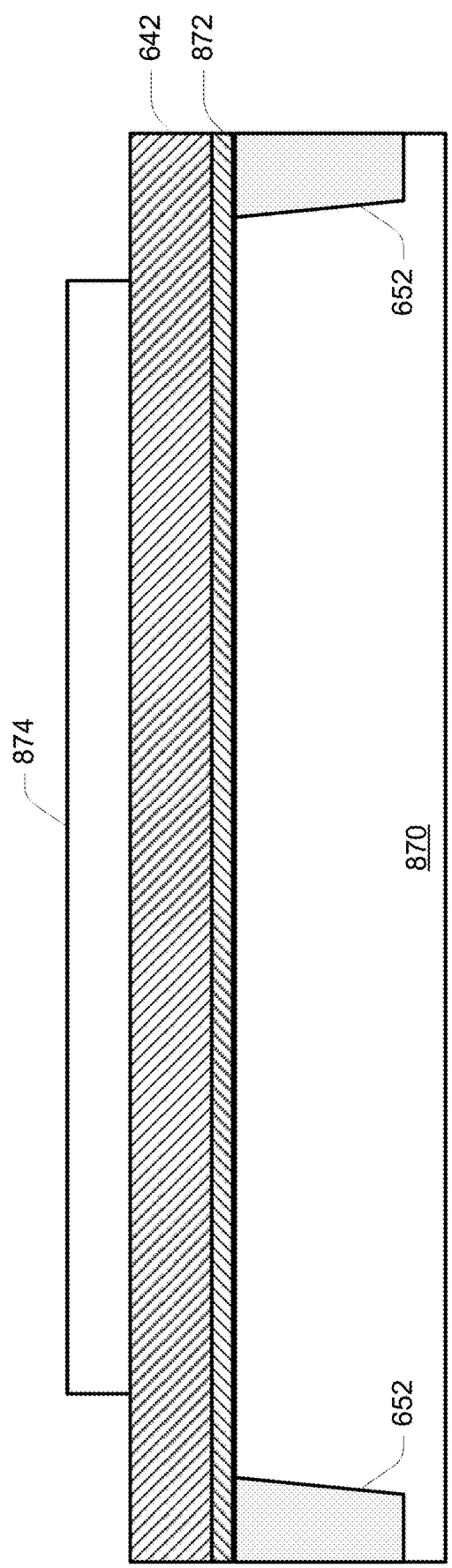
Figure 10E:
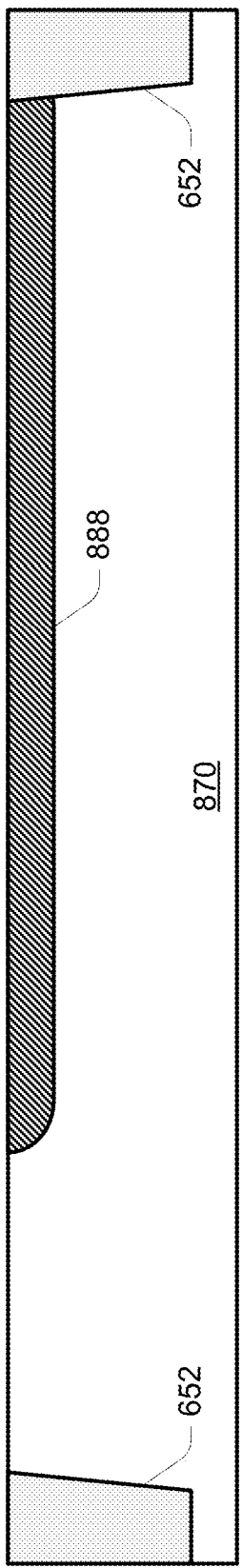
Figure 10F:
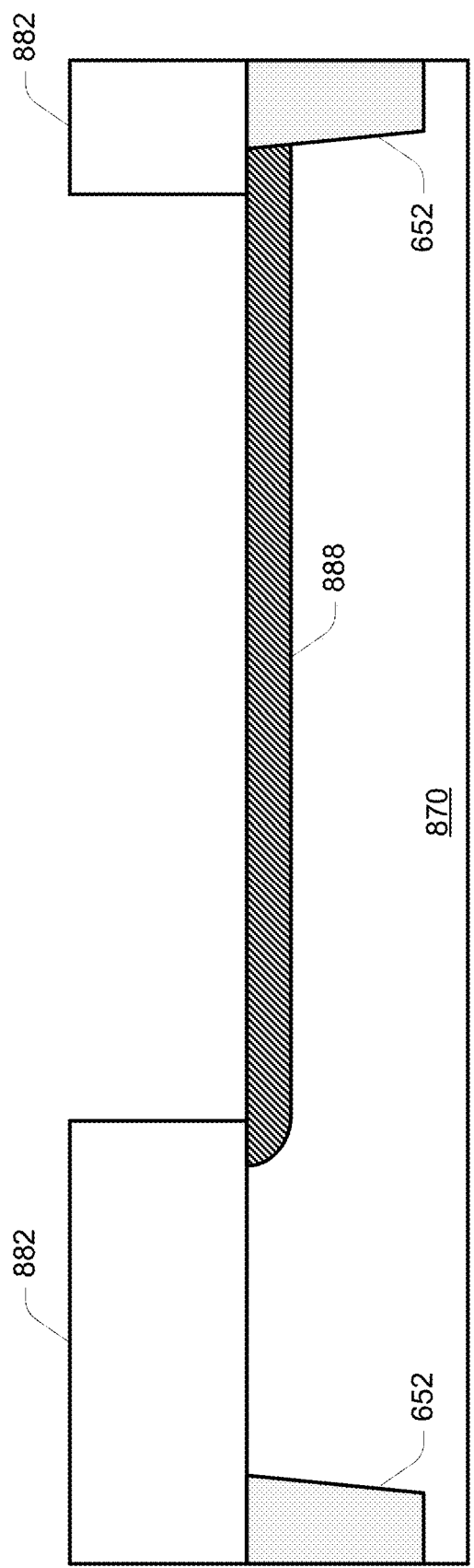
Figure 12A:
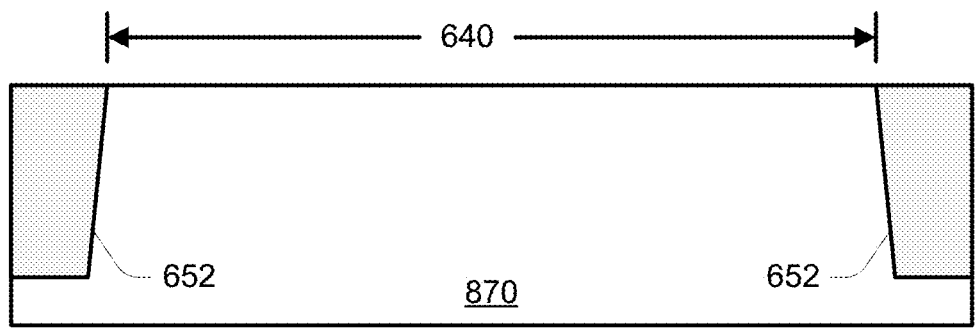
FIGS. 12A-12G are cross-sectional views of the field-effect transistor of FIG. 7 taken along line E-E at various stages of fabrication in accordance with an embodiment.
Figure 12B:
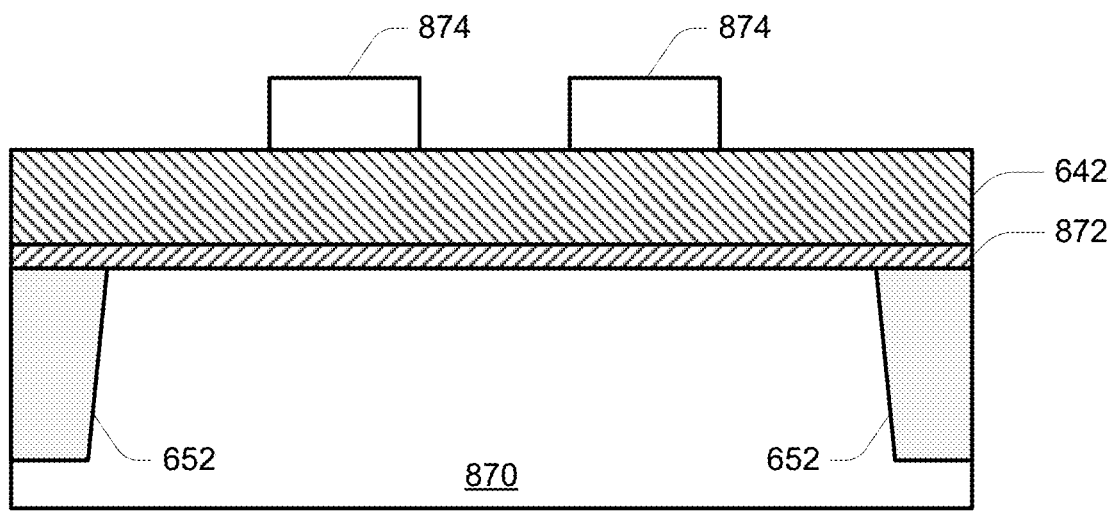
Figure 12C:
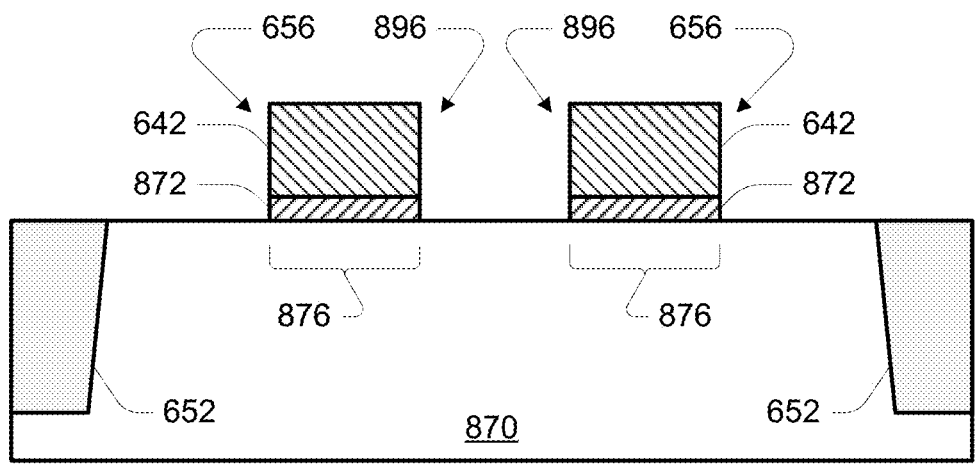
Figure 12D:
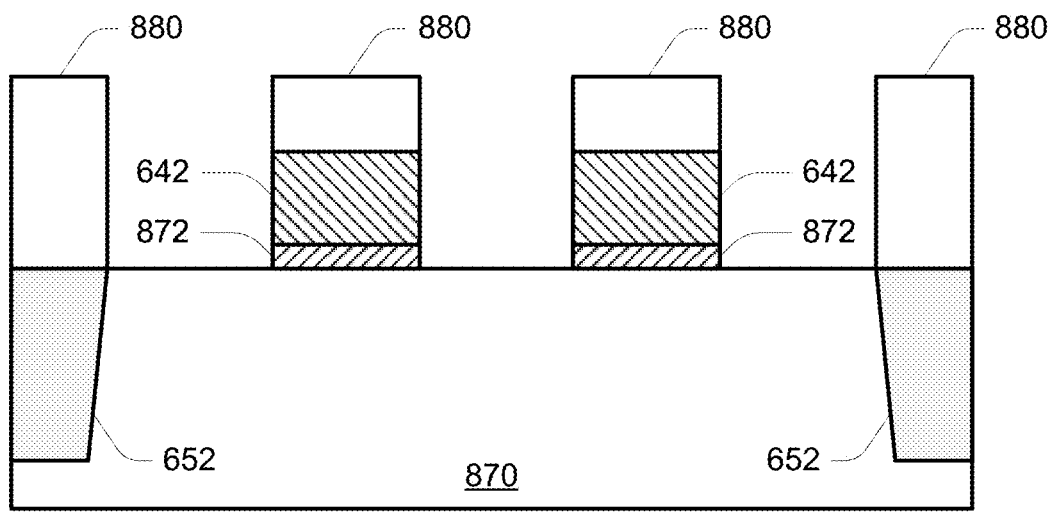
Figure 12E:
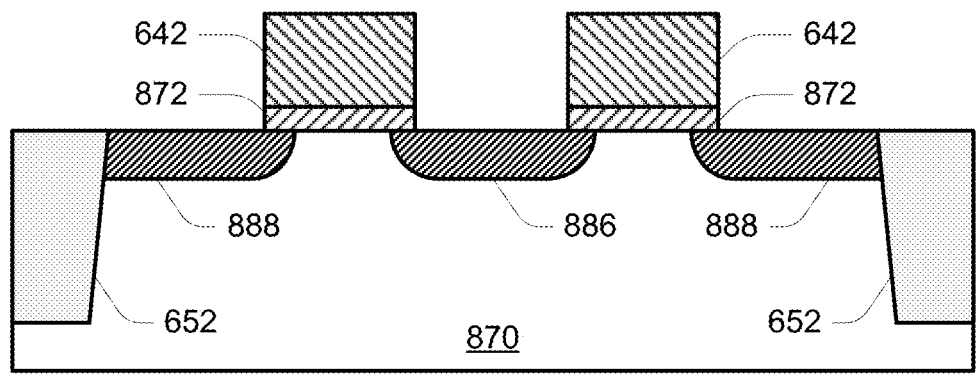
Figure 12F:
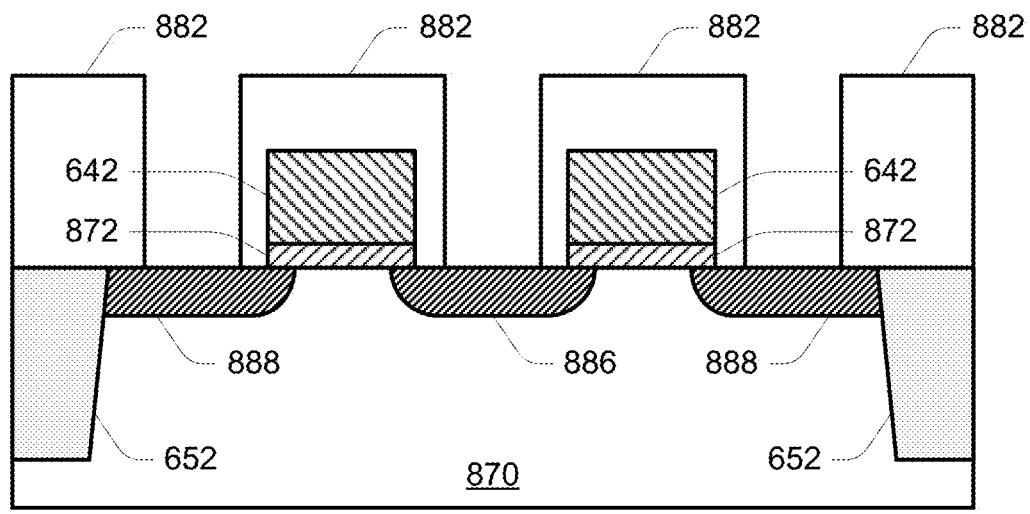
Figure 12G:
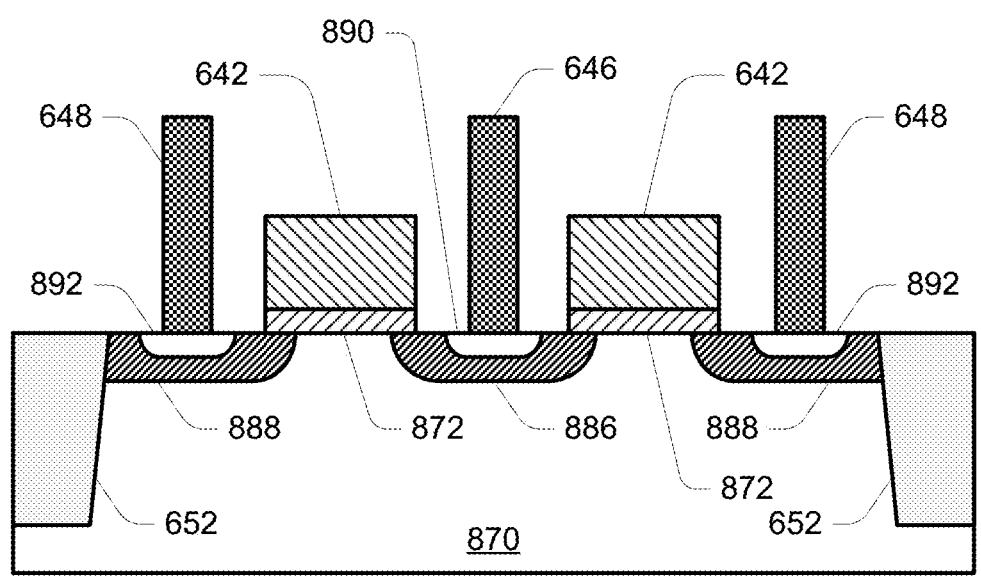

FIG. 7 is a top view of a field-effect transistor in accordance with an embodiment for use in discussing the cross-sectional views of FIGS. 8A-8G, 9A-9G, 10A-10G, 11A-11G and 12A-12G. FIG. 7 is an enlarged depiction of the embodiment of FIG. 6A with the addition of line A-A indicating where the cross-sectional views of FIGS. 8A-8G are taken, line B-B indicating where the cross-sectional views of FIGS. 9A-9G are taken, line C-C indicating where the cross-sectional views of FIGS. 10A-10G are taken, line D-D indicating where the cross-sectional views of FIGS. 11A-11G are taken, and line E-E indicating where the cross-sectional views of FIGS. 12A-12G are taken. It is noted that FIGS. 10A-10G might further represent the cross-sectional view taken alone line C'-C'.

In FIGS. 8A, 9A, 10A, 11A and 12A, isolation regions 652 might be formed in a semiconductor 870. The portion of the semiconductor 870 enclosed in the isolation regions 652 might define the active area 640 in which the future field-effect transistor might be formed. The semiconductor 870 might comprise silicon, such as monocrystalline silicon, or other semiconductor material. The semiconductor 870 might have a first conductivity type, such as a p-type conductivity. Isolation regions 652 might represent shallow-trench isolation structures as are well understood in the relevant art. For example, the isolation regions 652 might be formed by forming trenches in the semiconductor 870, and filling those trenches with one or more dielectric materials.

In FIGS. 8B, 9B, 10B, 11B and 12B, a dielectric 872 might be formed overlying (e.g., on) the structure of FIGS. 8A, 9A, 10A, 11A and 12A, e.g., overlying the active area 640 and isolation regions 652. The dielectric 872 might be formed of one or more dielectric materials. For example, the dielectric 872 might comprise, consist of, or consist essentially of an oxide, e.g., silicon dioxide, and/or might comprise, consist of, or consist essentially of a high-K dielectric material, such as aluminum oxides ($AlO_x$), hafnium oxides ($HfO_x$), hafnium aluminum oxides ($HfAlO_x$), hafnium silicon oxides ($HfSiO_x$), lanthanum oxides ($LaO_x$), tantalum oxides ($TaO_x$), zirconium oxides ($ZrO_x$), zirconium aluminum oxides ($ZrAlO_x$), or yttrium oxide ($Y_2O_3$), as well as any other dielectric material.

A conductor 642 might be formed overlying (e.g., on) the dielectric 872. The conductor 642 might be formed of one or more conductive materials. The conductor 642 might comprise, consist of, or consist essentially of conductively-doped semiconductor material (e.g., polysilicon) and/or might comprise, consist of, or consist essentially of metal, such as a refractory metal, or a metal-containing material, such as a refractory metal silicide or a metal nitride, e.g., a refractory metal nitride, as well as any other conductive material. For embodiments where the conductor 642 comprises, consists of, or consists essentially of a conductively-doped semiconductor material, e.g., a conductively-doped polysilicon, the conductor 642 might have the first conductivity type of the semiconductor 870, or might have a second conductivity type different than the first conductivity type. The second conductivity type might be opposite the first conductivity type. For example, for embodiments where the first conductivity type is a p-type conductivity, the second conductivity type might be an n-type conductivity. For such embodiments, e.g., either the first conductivity type or the second conductivity type, a conductivity level of the conductively-doped semiconductor material might be sufficient to impart conductivity.

A patterned mask 874 might be formed overlying (e.g., on) the conductor 642 to expose areas of the conductor 642 and dielectric 872 for removal. The mask 874 might represent a mask formed using a photolithographic process. Photolithographic processes are often used to define a desired pattern in integrated circuit fabrication. In a photolithographic process, a photoresist layer might be formed on the surface of the in-process device. The photoresist layer might contain a photo-sensitive polymer whose ease of removal is altered upon exposure to light or other electromagnetic radiation. To define the pattern, the photoresist layer might be selectively exposed to electromagnetic radiation and then developed to expose portions of the underlying layer. In a positive resist system, the portions of the photoresist layer exposed to the electromagnetic radiation are photosolubilized and a photolithographic mask is designed to block the electromagnetic radiation from those portions of the photoresist layer that are to remain after developing. In a negative resist systems, the portions of the photoresist layer exposed to the electromagnetic radiation are photopolymerized and the photolithographic mask is designed to block the electromagnetic radiation from those portions of the photoresist layer that are to be removed by developing.

In FIGS. 8C, 9C, 10C, 11C and 12C, the exposed areas of the conductor 642 and the dielectric 872 might be removed, e.g., anisotropically. For example, a reactive ion etch process might be used to remove portions of the conductor 642 and the dielectric 872 not covered by the patterned mask 874. The mask 874 might subsequently be removed, e.g., by ashing or otherwise removing the photoresist material. The conductor 642 might have a first portion 876, e.g., an annular portion, overlying the channel region of the future field-effect transistor, and a second portion 878, e.g., a spur portion, defining the spur 660.

In FIGS. 8D, 9D, 10D, 11D and 12D, a patterned mask 880 might be formed overlying (e.g., on) the conductor 642 and semiconductor 870 (e.g., active area 640) to expose areas of the semiconductor 870 for future source/drain regions. The mask 880 might represent a mask formed using a photolithographic process as previously described.

In FIGS. 8E, 9E, 10E, 11E and 12E, a first source/drain region 886 and a second source/drain region 888 might be formed in the exposed areas of the semiconductor 870. For example, the first source/drain region 886 and the second source/drain region 888 might be formed by implanting respective dopant species into the semiconductor 870. As is well understood in the art, such implantation might commonly involve acceleration of ions directed at a surface of the semiconductor 870. To produce an n-type conductivity, the dopant species might include ions of arsenic (As), antimony (Sb), phosphorus (P) or another n-type impurity. To produce a p-type conductivity, the dopant species might include ions of boron (B) or another p-type impurity. Other methods of forming conductive regions in a semiconductor are known. It might be expected for the first source/drain region 886 and the second source/drain region 888 to extend beneath the dielectric 872 corresponding to the portion 876 of the conductor 642. It is noted that the second source/drain 888 might include two portions, e.g., a first portion spaced apart from a first side of the first source/drain region 886 in the cross-sectional view taken along line C-C and a second portion spaced apart from a second side (e.g., opposite the first side) of the first source/drain region 886 in the cross-sectional view taken along line C'-C'. Both portions of the second source/drain region 888 might be electrically connected to one another in the finished field-effect transistor.

The first source/drain region 886 and the second source/drain region 888 might have the second conductivity type. A conductivity level of the first source/drain region 886 and the second source/drain region 888 might be sufficient to impart conductivity to these regions.

In FIGS. 8F, 9F, 10F, 11F and 12F, a patterned mask 882 might be formed overlying (e.g., on) the conductor 642 and semiconductor 870 (e.g., active area 640) to expose areas of the conductor 642, the first source/drain region 886 and the second source/drain region 888 for placement of contacts regions. The mask 882 might represent a mask formed using a photolithographic process as previously described.

In FIGS. 8G, 9G, 10G, 11G and 12G, a first contact region 890 and a second contact region 892 might be formed in the exposed areas of the first source/drain region 886 and the second source/drain region 888, respectively. For example, the first contact region 890 and the second contact region 892 might be formed by implanting respective dopant species into the first source/drain region 886 and the second source/drain region 888, respectively. It is noted that the second contact region 892 might include two portions, e.g., a first portion in the cross-sectional view taken along line C-C and a second portion in the cross-sectional view taken along line C'-C'. Both portions of the second contact region 892 might be electrically connected to one another in the finished field-effect transistor.

The first contact region 890 and the second contact region 892 might have the second conductivity type. A conductivity level of the first contact region 890 and the second contact region 892 might have a higher conductivity level than the first source/drain region 886 and the second source/drain region 888.

In FIGS. 8G, 9G, 10G, 11G and 12G, a third contact region 884 might further be formed in the exposed area of the conductor 642 for embodiments utilizing a conductively-doped semiconductor material for the conductor 642. For embodiments where the third contact region 884 is formed concurrently with the first contact region 890 and the second contact region 892, it might have the second conductivity type and a same conductivity level as the first contact region 890 and the second contact region 892. Alternatively, the third contact region 884 might be formed separately, either before or after formation of the first contact region 890 and the second contact region 892. For such embodiments, the third contact region 884 might have a same or different conductivity type than the first contact region 890 and the second contact region 892. In general, the third contact region 884 might have a same conductivity type, and a higher conductivity level, than the conductor 642.

Subsequent to formation of the first contact region 890, the second contact region 892, and the third contact region 884, one or more first source/drain contacts 646 might be formed on the first contact region 890, one or more second source/drain contacts 648 might be formed on the second contact region 892, and one or more gate contacts 644 might be formed on the third contact region 884. Each of the contacts 644, 646 and 648 might be formed of one or more conductive materials. They might each comprise, consist of, or consist essentially of conductively-doped semiconductor material (e.g., polysilicon) and/or might each comprise, consist of, or consist essentially of metal, such as a refractory metal, or a metal-containing material, such as a refractory metal silicide or a metal nitride, e.g., a refractory metal nitride, as well as any other conductive material. For embodiments where such contacts comprise, consist of, or consist essentially of a conductively-doped semiconductor material, e.g., polysilicon, that contact might have the same conductivity type as its underlying contact region.

Figure 13A:
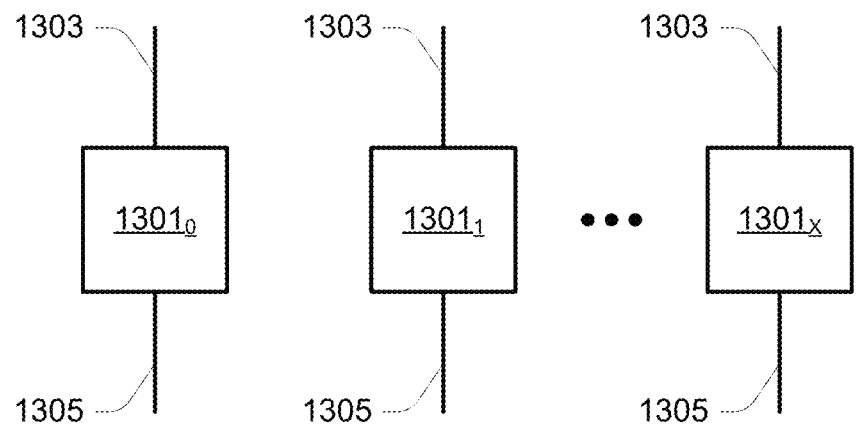
FIGS. 13A-13B are block schematics of matched circuits for use with embodiments.
Figure 13B:
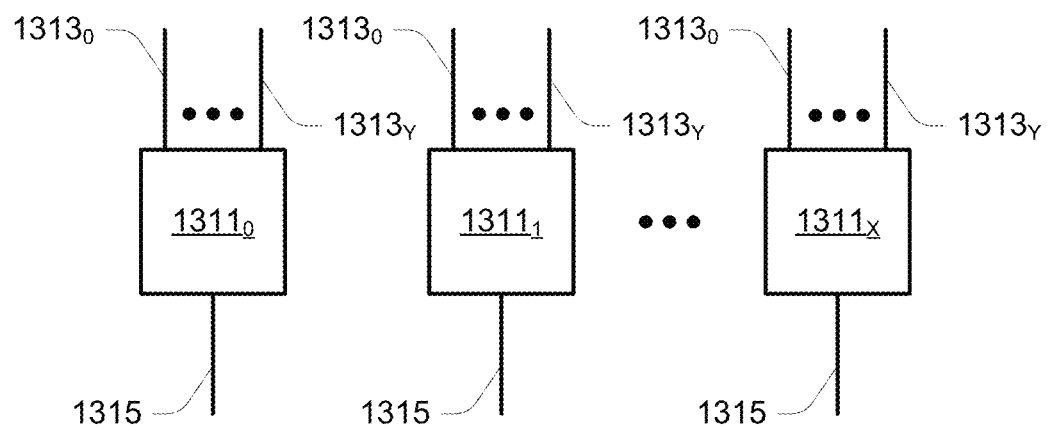

FIGS. 13A-13B are block schematics of matched circuits for use with embodiments. FIG. 13A depicts a plurality of matched circuits (e.g., integrated circuits) $1301_0$-$1301_X$. Each circuit $1301_0$-$1301_X$ has an input 1303 and an output 1305. Each circuit $1301_0$-$1301_X$ might have the same configuration. For example, each of the circuits $1301_0$-$1301_X$ might be identical in design. Each circuit $1301_0$-$1301_X$ might include one or more field-effect transistors in accordance with embodiments.

Each circuit $1301_0$-$1301_X$ might represent a single-ended input/output buffer, and might be a portion of an I/O control circuitry 112 of a memory 100 with each circuit $1301_0$-$1301_X$ connected (e.g., selectively connected) to a respective I/O line to the memory 100 or DQ line from the memory 100, for example. Alternatively, or in addition, each circuit $1301_0$-$1301_X$ might represent a voltage regulator and might be a portion of a row decode circuitry 108 with each circuit $1301_0$-$1301_X$ connected (e.g., selectively connected) to a respective access line of an array of memory cells 104. Alternatively, or in addition, each circuit $1301_0$-$1301_X$ might represent a single-ended sense circuit and might be a portion of a data register 120 of a memory 100 with each circuit $1301_0$-$1301_X$ connected (e.g., selectively connected) to a respective data line of an array of memory cells 104.

FIG. 13B depicts a plurality of matched circuits (e.g., integrated circuits) $1311_0$-$1311_X$. Each circuit $1311_0$-$1311_X$ has two or more inputs $1313_0$-$1313_Y$ and an output 1315. Each circuit $1311_0$-$1311_X$ might have the same configuration. For example, each of the circuits $1311_0$-$1311_X$ might be identical in design. Each circuit $1311_0$-$1311_X$ might include one or more field-effect transistors in accordance with embodiments.

Each circuit $1311_0$-$1311_X$ might have two inputs 1313 and represent a differential input/output buffer, and might be a portion of an I/O control circuitry 112 of a memory 100 with each circuit $1311_0$-$1311_X$ connected (e.g., selectively connected) to a respective I/O line to the memory 100 or DQ line from the memory 100, for example. Alternatively, or in addition, each circuit $1311_0$-$1311_X$ might have two inputs 1313 and represent a comparator or differential amplifier and might each be a portion of a respective voltage regulator connected (e.g., selectively connected) to a respective access line of an array of memory cells 104. Alternatively, or in addition, each circuit $1311_0$-$1311_X$ might represent a logic gate (e.g., AND gate, NAND gate, OR gate, NOR gate, XOR gate, etc.) and might be a portion of a control logic 116 of a memory 100.

CONCLUSION

Although specific embodiments have been illustrated and described herein, it will be appreciated by those of ordinary skill in the art that any arrangement that is calculated to achieve the same purpose might be substituted for the specific embodiments shown. Many adaptations of the embodiments will be apparent to those of ordinary skill in the art. Accordingly, this application is intended to cover any adaptations or variations of the embodiments.

What is claimed is:

1. A field-effect transistor, comprising:
   a semiconductor material having a first conductivity type;
   a first source/drain region having a second conductivity type different than the first conductivity type;
   a second source/drain region having the second conductivity type;
   a first contact connected to the first source/drain region;
   a conductor overlying an active area of the semiconductor material, wherein the conductor comprises an annular portion surrounding the first contact, and a spur portion extending from an outer perimeter of the annular portion of the conductor;
   a second contact connected to the second source/drain region outside the annular portion of the conductor;
   a dielectric between the conductor and the active area; and
   a third contact overlying the active area and connected to the spur portion of the conductor.

2. The field-effect transistor of claim 1, wherein the semiconductor material has a first conductivity type, the first source/drain region has a second conductivity type different than the first conductivity type, and the second source/drain region has the second conductivity type.

3. The field-effect transistor of claim 1, wherein the spur portion of the conductor has a first portion extending from the outer perimeter of the annular portion of the conductor in a first direction, and a second portion extending from the first portion of the spur portion of the conductor in a second direction different than the first direction.

4. The field-effect transistor of claim 3, wherein the first portion of the spur portion of the conductor and the second portion of the spur portion of the conductor form an L-shape.

5. The field-effect transistor of claim 4, wherein the first portion of the spur portion of the conductor is shorter than the second portion of the spur portion of the conductor.

6. The field-effect transistor of claim 1, wherein an entirety of the conductor is overlying the active area.

7. The field-effect transistor of claim 1, wherein the dielectric is a high-K dielectric.

8. The field-effect transistor of claim 1, further comprising a contact region formed in the spur portion of the conductor, wherein the third contact is connected to the spur portion of the conductor through the contact region.

9. The field-effect transistor of claim 8, wherein the conductor comprises a conductively-doped semiconductor material having a particular conductivity type and a first conductivity level, and wherein the contact region comprises a conductively-doped region of the conductor having the particular conductivity type and a second conductivity level higher than the first conductivity level.

10. The field-effect transistor of claim 9, wherein the particular conductivity type is the second conductivity type.

11. A field-effect transistor, comprising:
a semiconductor material having a first conductivity type;
a first source/drain region having a second conductivity type, different than the first conductivity type;
a first portion of a second source/drain region having the second conductivity type spaced apart from a first side of the first source/drain region;
a second portion of the second source/drain region having the second conductivity type spaced apart from a second side of the first source/drain region opposite the first side;
a plurality of first contacts connected to the first source/drain region;
a first plurality of second contacts connected to the first portion of the second source/drain region;
a second plurality of second contacts connected to the second portion of the second source/drain region;
a conductor overlying an active area of the semiconductor material, wherein the conductor comprises an annular portion surrounding the plurality of first contacts and extending between the first plurality of second contacts and the second plurality of second contacts, and a spur portion extending from an outer perimeter of the annular portion and devoid of any portion overlying an isolation region adjacent to the active area;
a dielectric between the conductor and the active area;
a channel region underlying the annular portion of the conductor and extending between the first source/drain region and the first portion of the second source/drain region, and between the first source/drain region and the second portion of the second source/drain region, and
a third contact connected to the spur portion of the conductor.

12. The field-effect transistor of claim 11, wherein the spur portion of the conductor extends from an edge of the outer perimeter of the annular portion of the conductor that extends in a direction of a length of the field-effect transistor.

13. The field-effect transistor of claim 11, wherein the spur portion of the conductor has a first portion extending from the outer perimeter of the annular portion of the conductor in a first direction, and a second portion extending from the first portion of the spur portion of the conductor in a second direction different than the first direction.

14. The field-effect transistor of claim 13, wherein the spur portion of the conductor further has a third portion extending from the second portion of the spur portion of the conductor in a third direction different than the second direction.

15. The field-effect transistor of claim 13, wherein the second direction is orthogonal to the first direction.

16. The field-effect transistor of claim 13, wherein the second portion of the spur portion of the conductor is connected to the first portion of the spur portion of the conductor in an angular fashion.

17. A memory, comprising:
an array of memory cells;
circuitry for access of the array of memory cells; and
a controller in communication with the circuitry for access of the array of memory cells;
wherein the circuitry for access of the array of memory cells comprises a field-effect transistor, comprising:
a semiconductor material having a first conductivity type;
a first source/drain region having a second conductivity type different than the first conductivity type;
a second source/drain region having the second conductivity type;
a first contact connected to the first source/drain region;
a conductor overlying an active area of the semiconductor material, wherein an entirety of the conductor is overlying the active area, and wherein the conductor comprises an annular portion surrounding the first contact, and a spur portion extending from an outer perimeter of the annular portion of the conductor;
a second contact connected to the second source/drain region outside the annular portion of the conductor;
a dielectric between the conductor and the active area; and
a third contact connected to the spur portion of the conductor.

18. The memory of claim 17, wherein the circuitry for access of the array of memory cells comprises a plurality of matched circuits, and wherein each matched circuit of the plurality of matched circuits comprises a field-effect transistor comprising:
a respective first source/drain region having the second conductivity type;
a respective second source/drain region having the second conductivity type;
a respective first contact connected to its respective first source/drain region;
a respective conductor overlying a respective active area of the semiconductor material, wherein an entirety of its respective conductor is overlying its respective active area, and wherein its respective conductor comprises an annular portion surrounding its respective first contact, and a spur portion extending from an outer perimeter of the annular portion of its respective conductor;
a respective second contact connected to its respective second source/drain region outside the annular portion of its respective conductor;
a respective dielectric between its respective conductor and its respective active area; and
a respective third contact connected to the spur portion of its respective conductor.

19. The memory of claim 18, wherein each matched circuit of the plurality of matched circuits is a same type of integrated circuit, and wherein the type of integrated circuit is selected from a group consisting of an input/output buffer, a comparator, a differential amplifier, a voltage regulator, a sense circuit, and a logic gate.

20. A method of forming a field-effect transistor, comprising:

forming an isolation region in a semiconductor material, thereby defining an active area in the semiconductor material;

forming a dielectric overlying the active area;

forming a conductor overlying the dielectric;

patterning the conductor and the dielectric overlying the active area to define an annular portion of the conductor overlying the active area and a spur portion of the conductor extending from the annular portion of the conductor and overlying the active area;

forming a first source/drain region in a first portion of the active area surrounded by the annular portion of the conductor;

forming a second source/drain region in a second portion of the active area outside of the annular portion of the conductor;

forming a first contact connected to the first source/drain region;

forming a second contact connected to the second source/drain region; and forming a third contact connected to the spur portion of the conductor.

21. The method of claim 20, wherein forming the isolation region in the semiconductor material comprises forming the isolation region in a semiconductor material having a first conductivity type, wherein forming the first source/drain region comprises forming a first source/drain region having a second conductivity type different than the first conductivity type, and wherein forming the second source/drain region comprises forming a second source/drain region having the second conductivity type.

22. The method of claim 20, wherein forming the dielectric comprises forming a high-K dielectric.

23. The method of claim 20, wherein forming the first contact connected to the first source/drain region comprises forming a plurality of first contacts connected to the first source/drain region, and wherein forming the second contact connected to the second source/drain region comprises forming a plurality of second contacts connected to the second source/drain region.

24. The method of claim 20, wherein forming the second source/drain region in the second portion of the active area outside of the annular portion of the conductor comprises forming a first portion of the second source/drain region in a second portion of the active area outside of the annular portion of the conductor and spaced apart from a first side of the first source/drain region, and wherein the method further comprises:

forming a second portion of the second source/drain region in a third portion of the active area outside of the annular portion of the conductor and spaced apart from a second side of the first source/drain region.

* * * * *